US011603749B2

(12) United States Patent
Yu et al.

(10) Patent No.: US 11,603,749 B2
(45) Date of Patent: Mar. 14, 2023

(54) FIELD OPERATIONS SYSTEM

(71) Applicant: Schlumberger Technology Corporation, Sugar Land, TX (US)

(72) Inventors: Yingwei Yu, Katy, TX (US); Sylvain Chambon, Katy, TX (US); Qiuhua Liu, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 942 days.

(21) Appl. No.: 16/192,584

(22) Filed: Nov. 15, 2018

(65) Prior Publication Data

US 2019/0147125 A1 May 16, 2019

Related U.S. Application Data

(60) Provisional application No. 62/586,288, filed on Nov. 15, 2017.

(51) Int. Cl.
*E21B 44/00* (2006.01)
*E21B 21/08* (2006.01)
*G06N 7/00* (2006.01)
*G01V 1/50* (2006.01)
*E21B 49/00* (2006.01)
(Continued)

(52) U.S. Cl.
CPC .............. *E21B 44/00* (2013.01); *E21B 21/08* (2013.01); *E21B 49/003* (2013.01); *G01V 1/50* (2013.01); *G01V 11/00* (2013.01); *G06F 17/15* (2013.01); *G06F 17/16* (2013.01); *G06F 30/20* (2020.01); *G06F 30/27* (2020.01); *G06N 3/0445* (2013.01); *G06N 3/0472* (2013.01); *G06N 3/08* (2013.01);
(Continued)

(58) Field of Classification Search
CPC ........ E21B 44/00; G06N 3/08; G06N 3/0454; G06F 30/27; G06T 13/00
See application file for complete search history.

(56) References Cited

U.S. PATENT DOCUMENTS 6,286,104 B1   9/2001 Buhle et al.
6,526,167 B1 * 2/2003 Numaoka ............ G06K 9/4652
                                                    382/157
(Continued)

FOREIGN PATENT DOCUMENTS

CN   103606006 A  *  2/2014
CN   106919977 A  *  7/2017  ........... G06N 3/0445
(Continued)

OTHER PUBLICATIONS

International Search Report and Written Opinion for the cross referenced International patent application PCT/US2018/061314 dated Feb. 1, 2019.
(Continued)

*Primary Examiner* — Douglas Kay
(74) *Attorney, Agent, or Firm* — Alec J. McGinn

(57) ABSTRACT

A method can include receiving multi-channel time series data of drilling operations; training a deep neural network (DNN) using the multi-channel time series data to generate a trained deep neural network as part of a computational simulator where the deep neural network includes at least one recurrent unit; simulating a drilling operation using the computational simulator to generate a simulation result; and rendering the simulation result to a display.

16 Claims, 23 Drawing Sheets

(51) Int. Cl.

| | |
|---|---|
| G01V 11/00 | (2006.01) |
| G06F 30/20 | (2020.01) |
| G06F 17/15 | (2006.01) |
| G06F 17/16 | (2006.01) |
| G06N 3/04 | (2006.01) |
| G06F 30/27 | (2020.01) |
| G06N 3/08 | (2006.01) |
| G06T 13/80 | (2011.01) |

(52) U.S. Cl.
CPC ........... *G06N 7/00* (2013.01); *G01V 2200/14* (2013.01); *G01V 2200/16* (2013.01); *G06T 13/80* (2013.01)

(56) References Cited

U.S. PATENT DOCUMENTS

| | | |
|---|---|---|
| 7,128,167 B2 | 10/2006 | Dunlop et al. |
| 7,321,882 B2 | 1/2008 | Jaeger |
| 8,504,361 B2 | 8/2013 | Collobert et al. |
| 10,066,473 B2 | 9/2018 | Khare |
| 10,400,573 B2 | 9/2019 | Yang et al. |
| 11,474,486 B2 | 10/2022 | Berntorp |
| 2004/0117043 A1 | 6/2004 | Touzov |
| 2004/0124009 A1 | 7/2004 | Hoteit et al. |
| 2004/0124012 A1 | 7/2004 | Dunlop et al. |
| 2004/0223480 A1 | 11/2004 | Nguyen et al. |
| 2004/0256152 A1* | 12/2004 | Dashevskiy ............ E21B 44/00 175/25 |
| 2006/0047607 A1 | 3/2006 | Boydon et al. |
| 2006/0221081 A1* | 10/2006 | Cohen ..................... G06T 13/00 345/473 |
| 2007/0022068 A1 | 1/2007 | Linsker |
| 2007/0118346 A1 | 5/2007 | Wen et al. |
| 2007/0185696 A1* | 8/2007 | Moran .................. G05B 13/027 703/10 |
| 2010/0302129 A1* | 12/2010 | Kastrup ................ G06F 3/1446 345/1.3 |
| 2012/0123757 A1* | 5/2012 | Ertas ....................... E21B 44/00 703/2 |
| 2013/0013543 A1* | 1/2013 | Dull ..................... G05B 13/027 706/25 |
| 2013/0282635 A1 | 10/2013 | Dull et al. |
| 2015/0308204 A1* | 10/2015 | Johnson ............... G05B 13/048 700/282 |
| 2016/0099010 A1 | 4/2016 | Sainath et al. |
| 2016/0231716 A1* | 8/2016 | Johnson ............... G05B 13/041 |
| 2018/0052078 A1* | 2/2018 | Newberger .......... G01M 15/05 |
| 2018/0188403 A1* | 7/2018 | Halsey ..................... G01V 1/50 |
| 2019/0034558 A1* | 1/2019 | Leeman-Munk ... G06F 3/04842 |
| 2019/0065961 A1 | 2/2019 | Szu |
| 2019/0145239 A1 | 5/2019 | Yu et al. |
| 2020/0104437 A1 | 4/2020 | Hong et al. |
| 2021/0148213 A1* | 5/2021 | Madasu ................ E21B 49/003 |
| 2021/0166115 A1 | 6/2021 | Yu |
| 2022/0013239 A1 | 1/2022 | Iwamori et al. |
| 2022/0187253 A1 | 6/2022 | Takamine et al. |

FOREIGN PATENT DOCUMENTS

| | | | |
|---|---|---|---|
| CN | 108363361 A | * | 8/2018 |
| JP | 2011123187 A | * | 6/2011 |

OTHER PUBLICATIONS

Del Moral, "Nonlinear Filtering: Interacting Particle Solution," Markov Processes and Related Fields. 2 (4), 1996, pp. 555-580.

Deng, et al., "ImageNet: A large-scale hierarchical image database," In Proc. CVPR, 2009.

Gers, et al., "Learning to Forget: Continual Prediction with LSTM," Journal of Neural Computation, vol. 12, Issue 10, Oct. 2000, pp. 2451-2471.

Goodfellow, et al., "Deep Learning," MIT Press book, 2016.

Hochreiter, et al., "Long Short-Term Memory," Neural Computation 9(8), pp. 1735-1780, 1997.

Krishnan, et al., "Deep Kalman Filters," submitted on Nov. 16, 2015, Courant Institute of Mathematical Sciences, New York University, retrieved at https://arxiv.org/abs/1511.05121.

Pearson, "On Lines and Planes of Closest Fit to Systems of Points in Space," Philosophical Magazine 2: 1901, pp. 559-572.

Rosenblatt, "Principles of neurodynamics: Perceptrons and the Theory of Brain Mechanisms," Spartan Books, Washington DC, 1961.

Shashua et al., "Deep Robust Kalman Filter", submitted on Mar. 7, 2017, retrieved at https://arxiv.org/pdf/1703.02310.pdf.

Silver, et al, "Mastering the Game of Go with Deep Neural Networks and Tree Search," Nature, vol. 529, Jan. 28, 2016, pp. 484-489.

Simonyan, et al., "Very Deep Convolutional Networks for Large-Scale Image Recognition," Conference paper at International Conference on Learning Representations 2015.

Thrun, "Particle Filters in Robotics," UAI 2002 Proceedings of the Eighteenth conference on Uncertainty in artificial intelligence, 2002, pp. 511-518.

Van den Oord, "WaveNet: A Generative Model for Raw Audio," introduced at WaveNet, a deep neural network for generating raw audio waveforms, 2016.

Yu, et al., "Recorded Well Data Enriches the Testing of Automation Systems by Using a Deep Neural Network Approach," IADC/SPE-189591-MS, IADC/SPE Drilling Conference and Exhibition held in Fort Worth, TX, Mar. 6-8, 2018.

Stubberud S. C. et al., "System identification using the neural-extended Kalman filter for state-estimation and controller modification", Neural networks, 2008, pp. 1352-1357.

De Lima, D. P. et al., "neural Network Training Using Unscented and Extended Kalman Filter", Robotics Automation Engineering Journal, 2017, 1(4), 6 pages.

Yu, Y. et al., "Using Deep Kalman Filter to Predict Drilling Time Series", IPTC-19207-MS, 2019, pp. 1-11.

Haugen, et al. "History Matching Using the Ensemble Kalman Filter on a North Sea Field Case", Society of Petroleum Engineers, 2008, pp. 382-291.

Simon, "Using Nonlinear Kalman Filtering to Estimate Signals", 2013, pp. 1-16.

Genc, S. "Parametric System Identification Using Deep Convolutional Neural Networks", IEEE, 2017, pp. 2112-2119.

\* cited by examiner

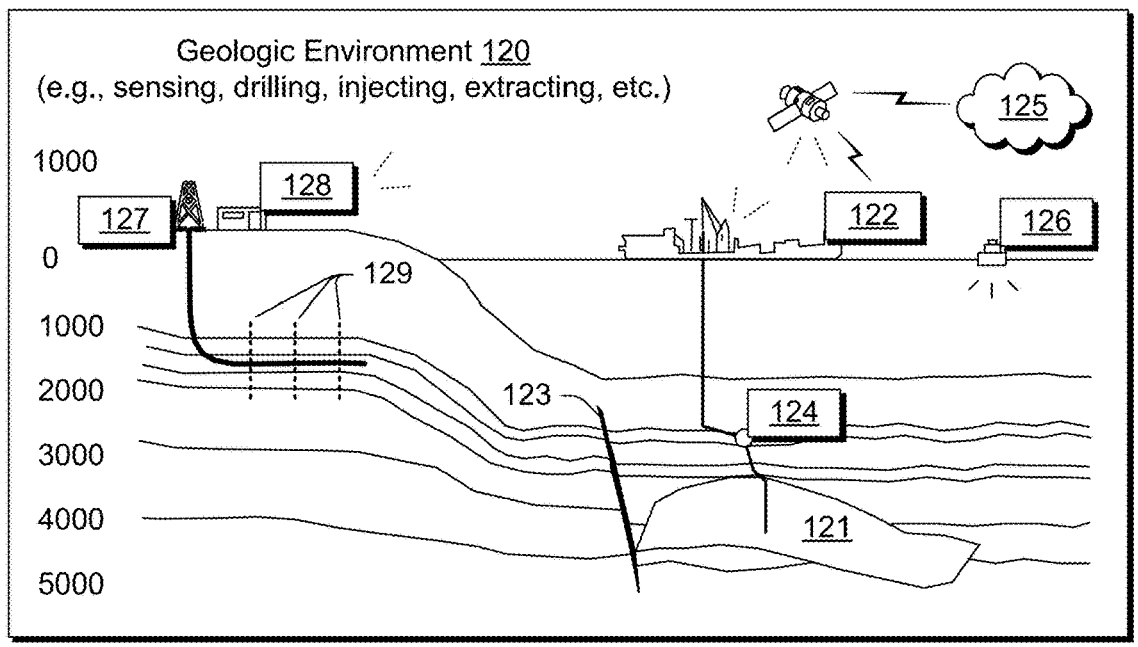
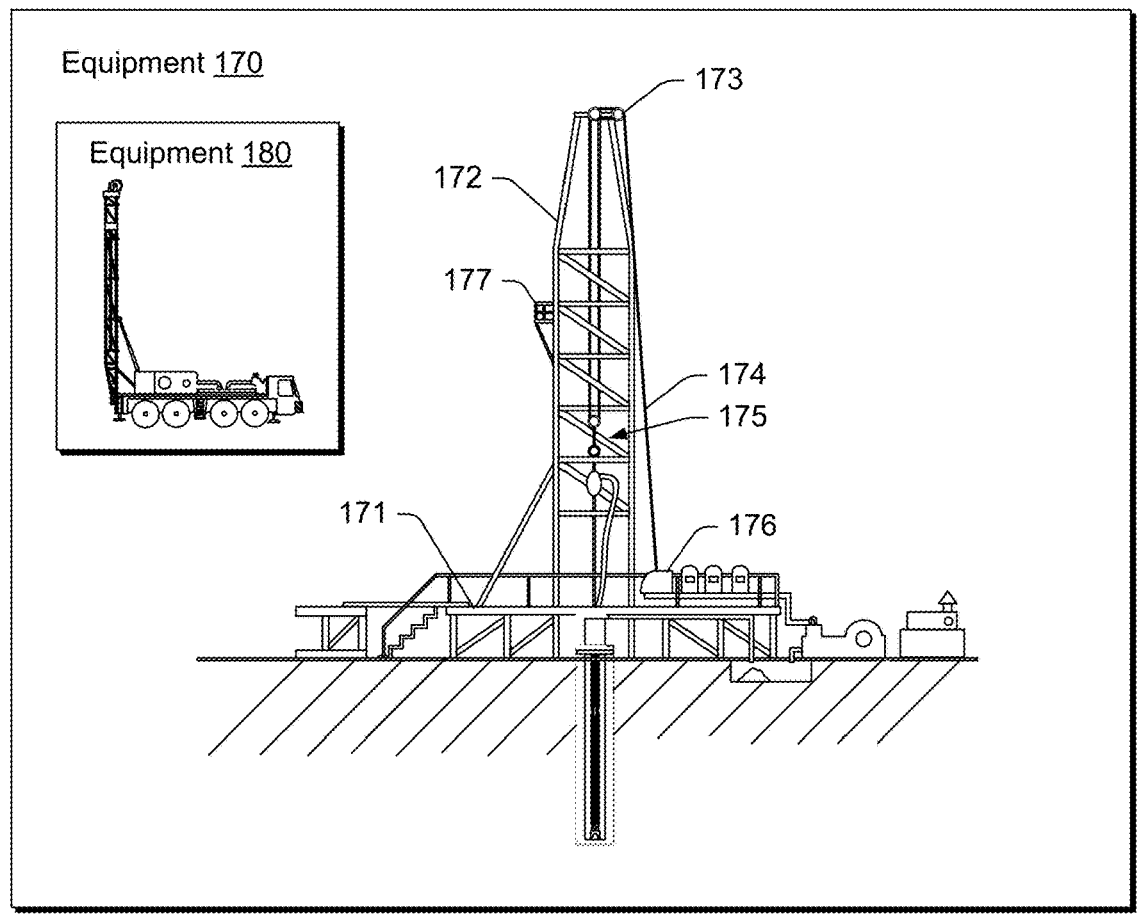
Fig. 1

System 810
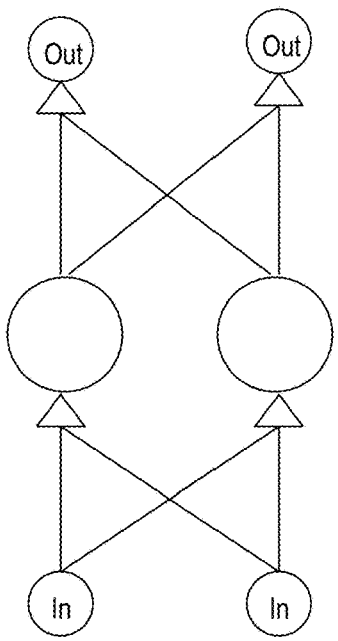
System 820
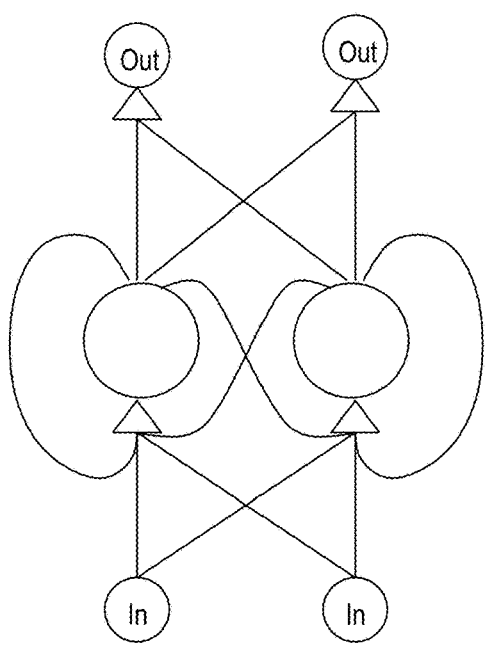
System 830
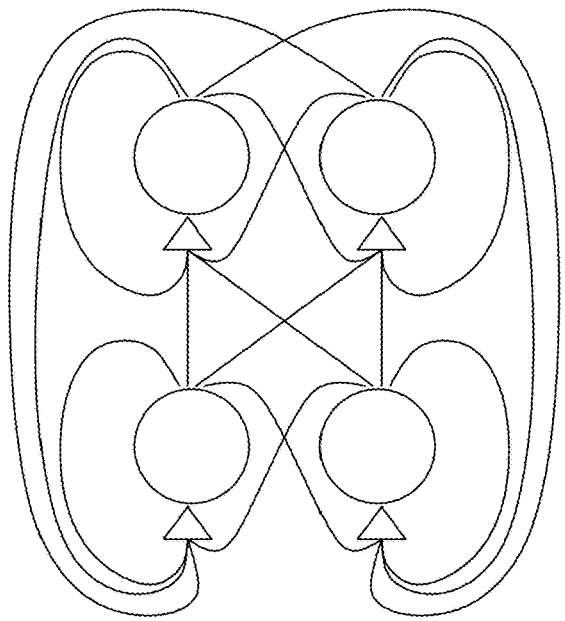
Fig. 8

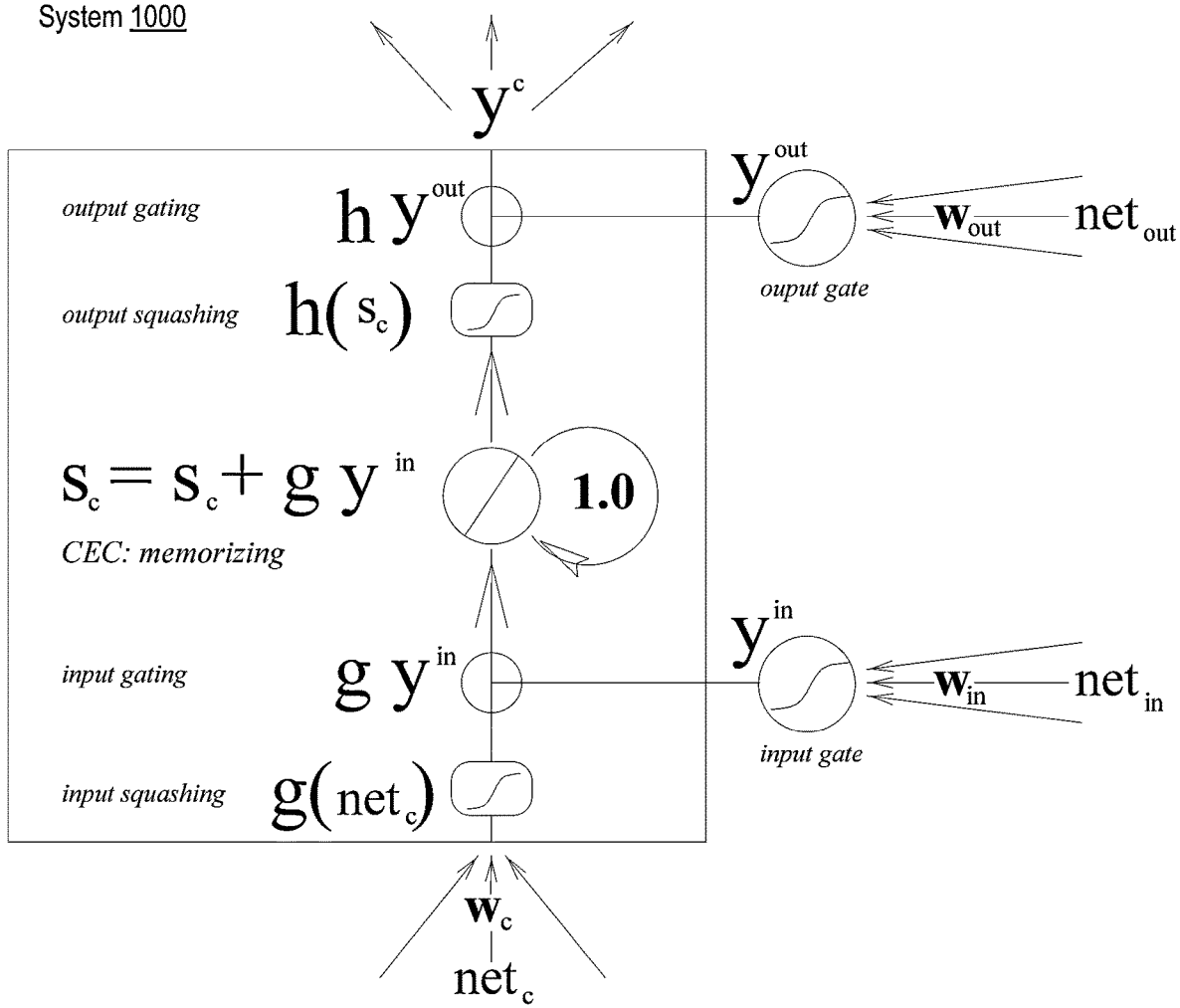

$net_{in}$ is the input to the input gate
$net_{out}$ is the input to the output gate
$net_c$ is the input to the cell as represented by the box
$w_{in}$ is a weight applied to $net_{in}$
$w_{out}$ is a weight applied to $net_{out}$
$w_c$ is a weight applied to $net_c$
$s_c$ is the state of the cell
g is a function that squashes the cell's input
h is a function that squashes the cell's output
$y_{in}$ is the input gate activation
$y_{out}$ is the output gate activation
$y_c$ is the cell activation

Fig. 10

System 1100

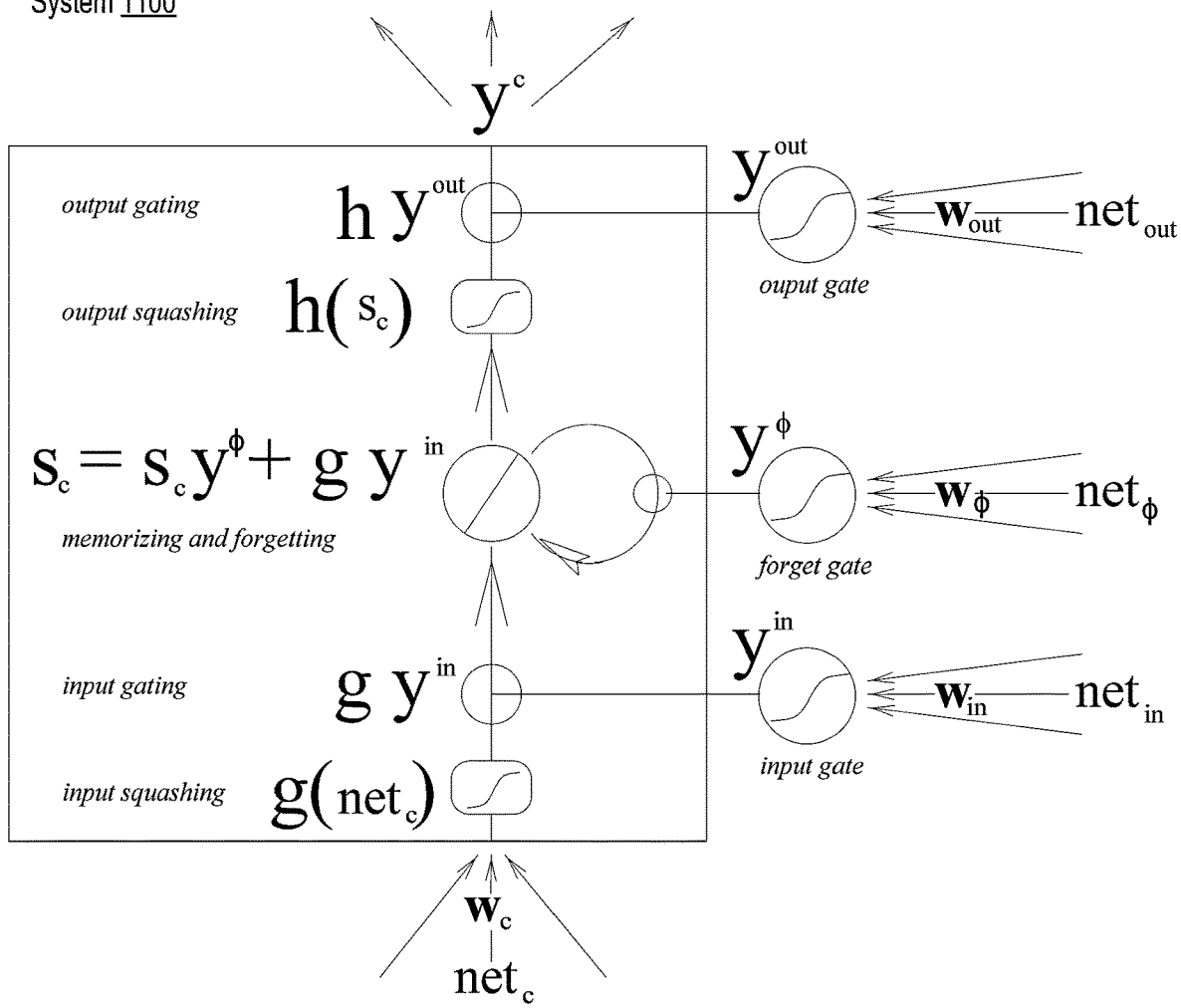

$net_{in}$ is the input to the input gate
$net_\phi$ is the input to the forget gate
$net_{out}$ is the input to the output gate
$net_c$ is the input to the cell as represented by the box
$w_{in}$ is a weight applied to $net_{in}$
$w_\phi$ is a weight applied to $net_\phi$
$w_{out}$ is a weight applied to $net_{out}$
$w_c$ is a weight applied to $net_c$
$s_c$ is the state of the cell
g is a function that squashes the cell's input
h is a function that squashes the cell's output
$y_{in}$ is the input gate activation
$y_\phi$ is the forget gate activation
$y_{out}$ is the output gate activation
$y_c$ is the cell activation

Fig. 11

Filters 1300
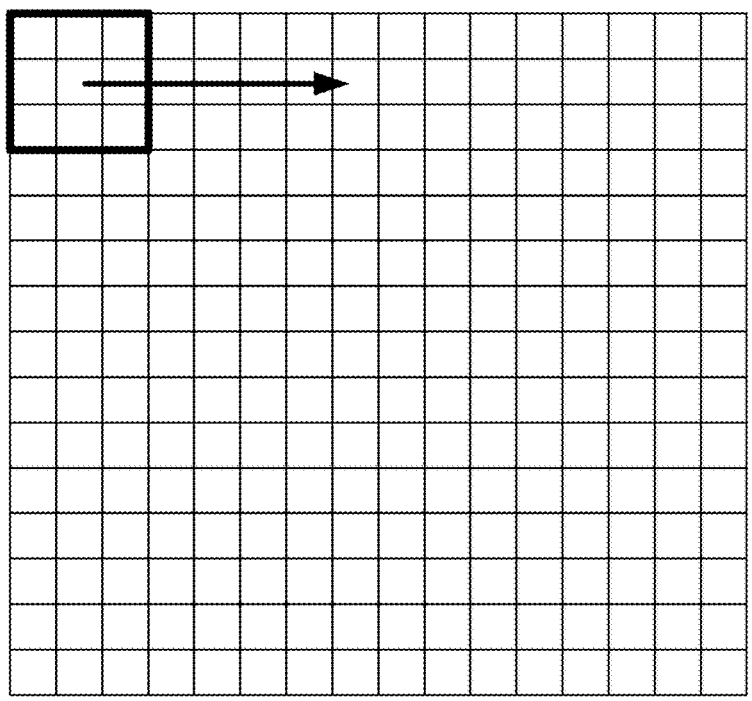
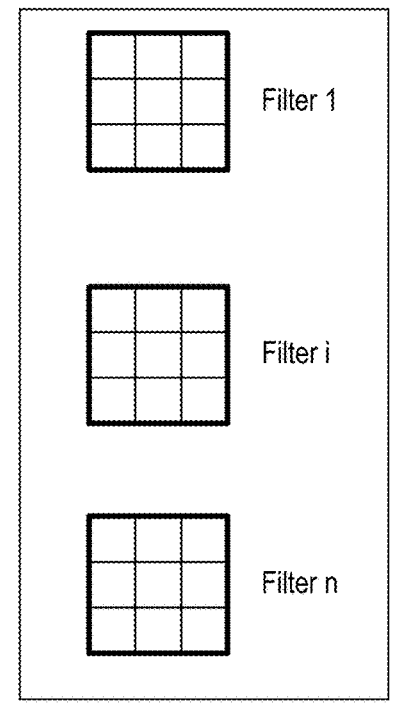
Input 2D
Filter Bank
Fig. 13

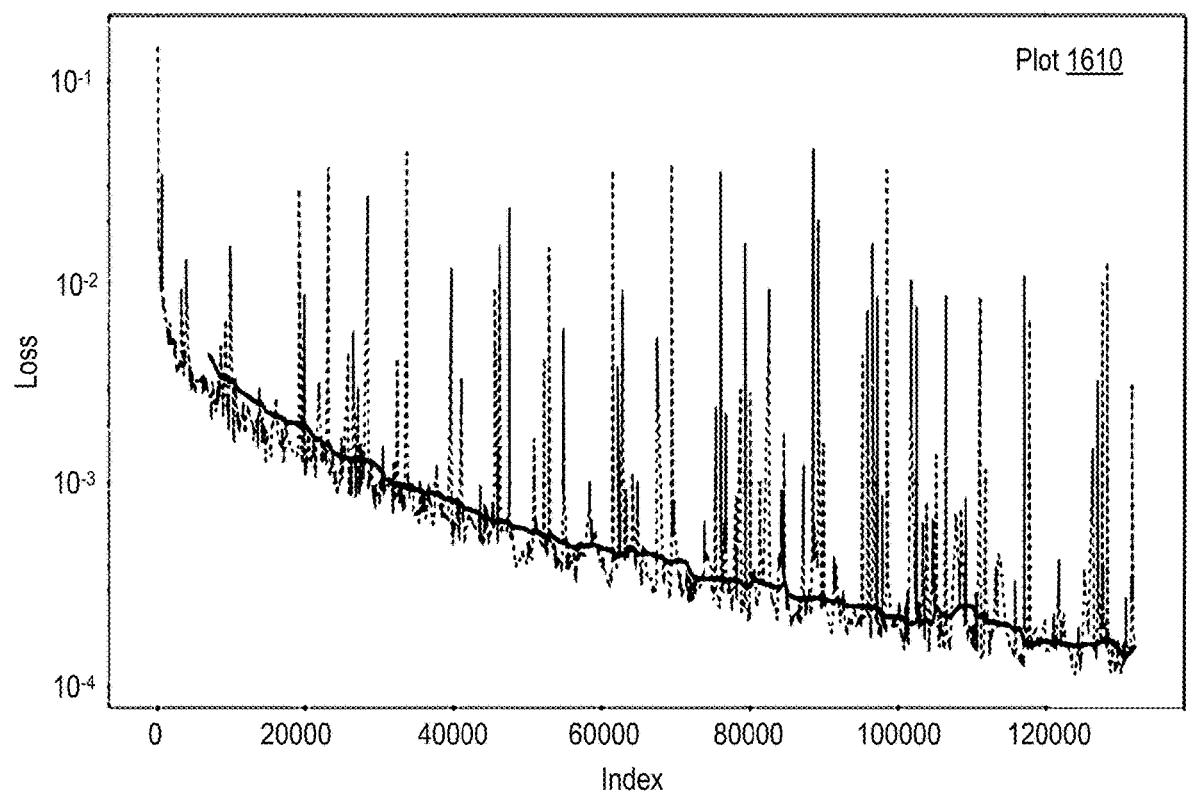
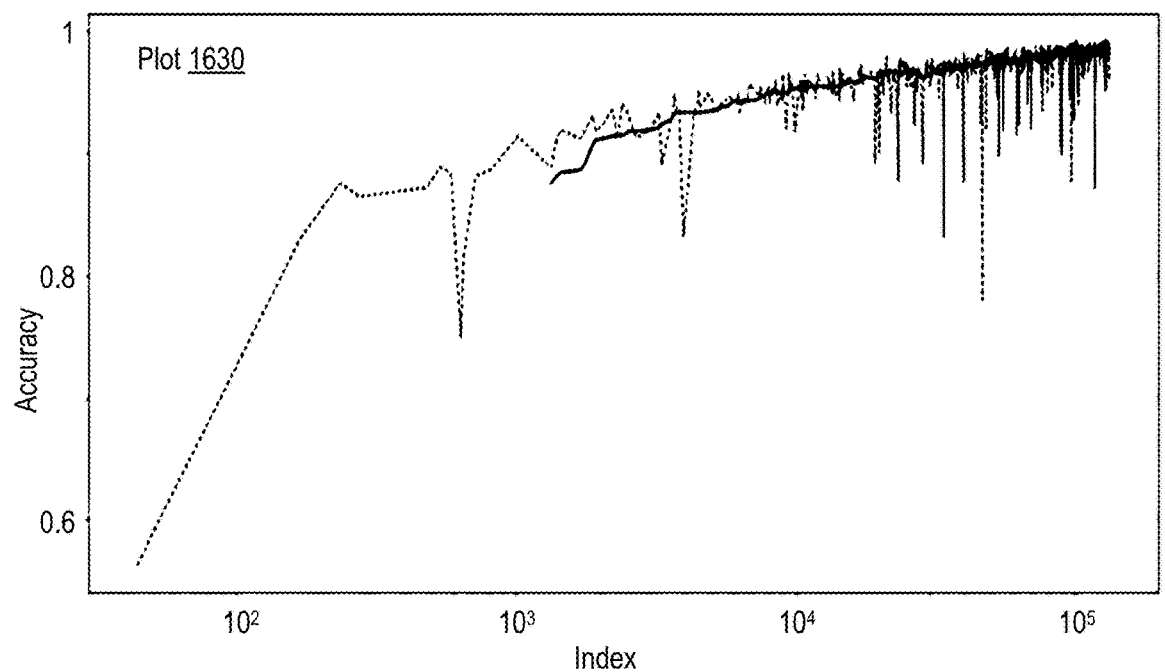
Fig. 16

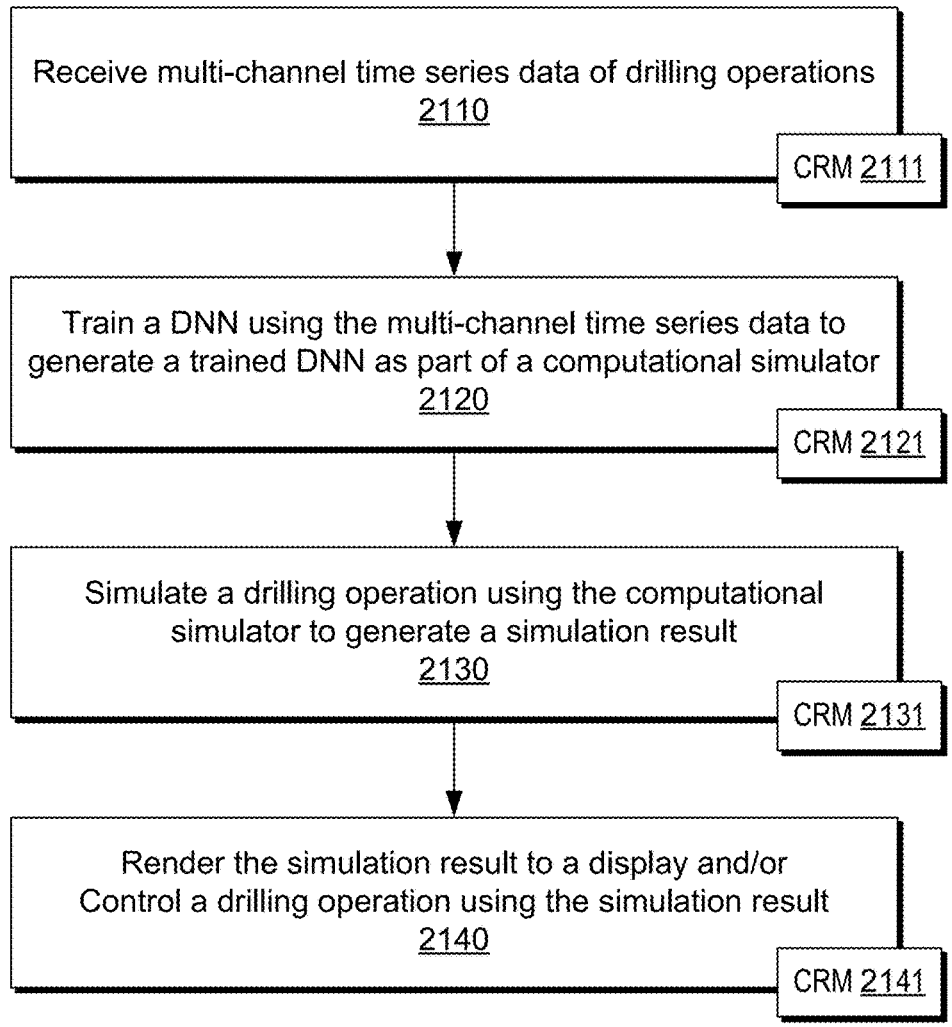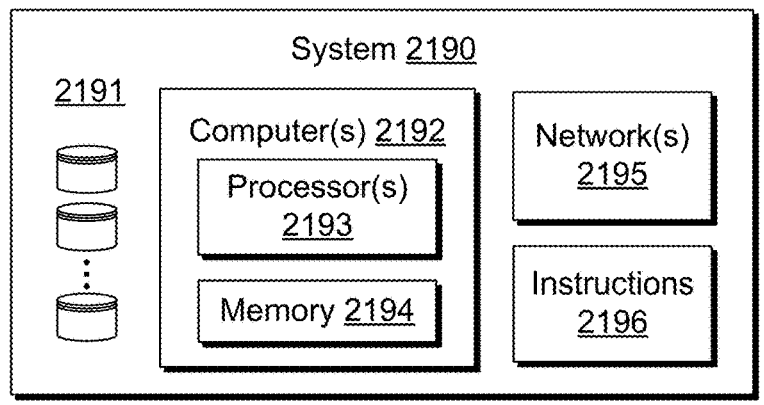
Fig. 21

FIELD OPERATIONS SYSTEM

RELATED APPLICATIONS

This application claims priority to and the benefit of a US Provisional Application having Ser. No. 62/586,288, filed 15 Nov. 2017, which is incorporated by reference herein.

BACKGROUND

A resource field can be an accumulation, pool or group of pools of one or more resources (e.g., oil, gas, oil and gas) in a subsurface environment. A resource field can include at least one reservoir. A reservoir may be shaped in a manner that can trap hydrocarbons and may be covered by an impermeable or sealing rock. A bore can be drilled into an environment where the bore may be utilized to form a well that can be utilized in producing hydrocarbons from a reservoir.

A rig can be a system of components that can be operated to form a bore in an environment, to transport equipment into and out of a bore in an environment, etc. As an example, a rig can include a system that can be used to drill a bore and to acquire information about an environment, about drilling, etc. A resource field may be an onshore field, an offshore field or an on- and offshore field. A rig can include components for performing operations onshore and/or offshore. A rig may be, for example, vessel-based, offshore platform-based, onshore, etc.

Field planning can occur over one or more phases, which can include an exploration phase that aims to identify and assess an environment (e.g., a prospect, a play, etc.), which may include drilling of one or more bores (e.g., one or more exploratory wells, etc.). Other phases can include appraisal, development and production phases.

SUMMARY

A method can include receiving multi-channel time series data of drilling operations; training a deep neural network (DNN) using the multi-channel time series data to generate a trained deep neural network as part of a computational simulator where the deep neural network includes at least one recurrent unit; simulating a drilling operation using the computational simulator to generate a simulation result; and rendering the simulation result to a display. A system can include a processor; memory accessible by the processor; processor-executable instructions stored in the memory and executable to instruct the system to: receive multi-channel time series data of drilling operations; train a deep neural network (DNN) using the multi-channel time series data to generate a trained deep neural network where the deep neural network includes at least one recurrent unit; simulate a drilling operation using the trained DNN to generate a simulation result; and render the simulation result to a display. One or more computer-readable storage media can include processor-executable instructions to instruct a computing system to: receive multi-channel time series data of drilling operations; train a deep neural network (DNN) using the multi-channel time series data to generate a trained deep neural network where the deep neural network includes at least one recurrent unit; simulate a drilling operation using the trained DNN to generate a simulation result; and render the simulation result to a display. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 1 illustrates examples of equipment in a geologic environment;

FIG. 8 illustrates examples of systems;

FIG. 10 illustrates an example of a system;

FIG. 11 illustrates an example of a system;

FIG. 13 illustrates examples of filters;

FIG. 16 illustrates examples of plots;

FIG. 21 illustrates an example of a method and an example of a system;

DETAILED DESCRIPTION

Figure 2:
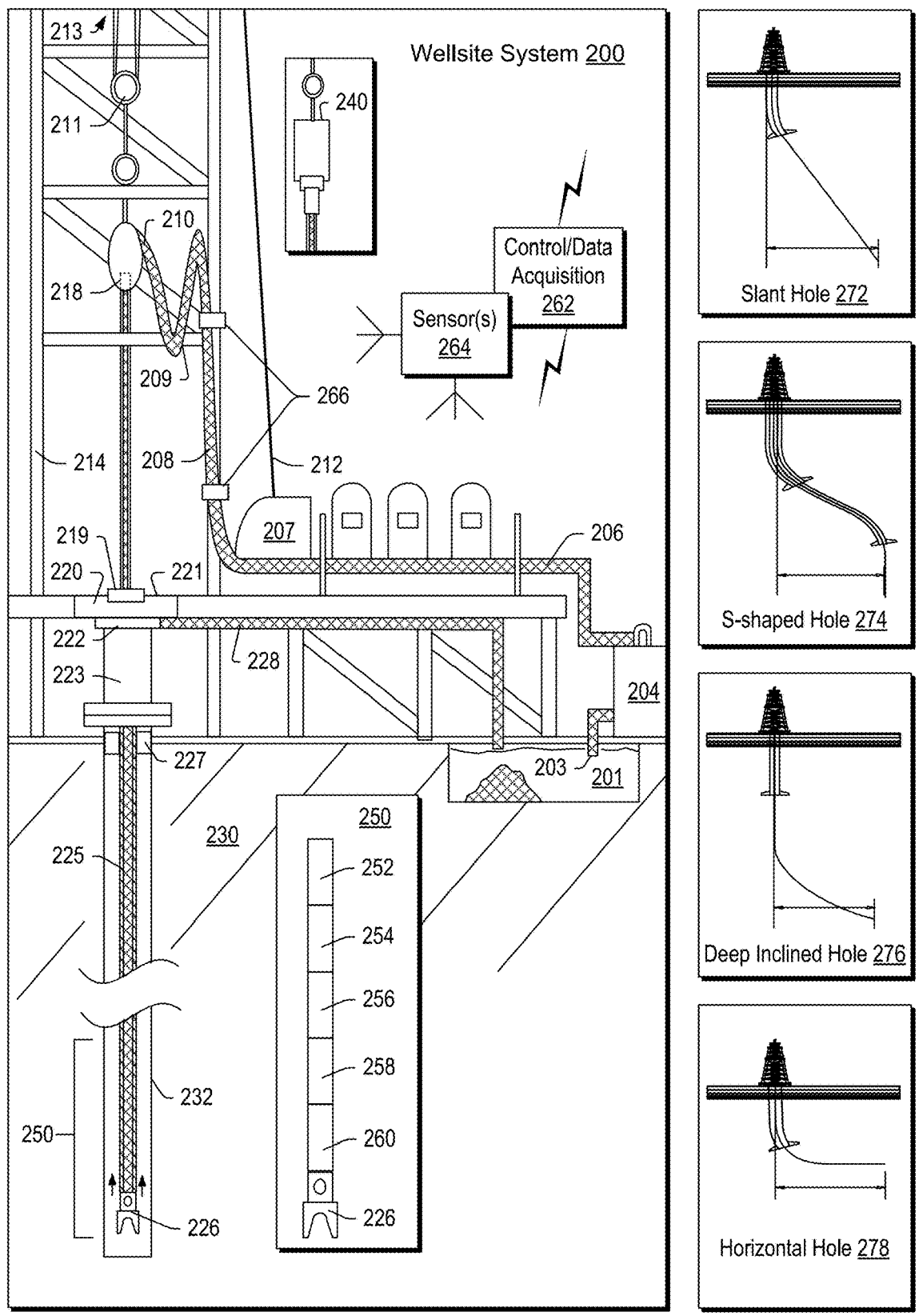
FIG. 2 illustrates examples of equipment and examples of hole types.

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

FIG. 1 shows an example of a geologic environment 120. In FIG. 1, the geologic environment 120 may be a sedimentary basin that includes layers (e.g., stratification) that include a reservoir 121 and that may be, for example, intersected by a fault 123 (e.g., or faults). As an example, the geologic environment 120 may be outfitted with any of a variety of sensors, detectors, actuators, etc. For example, equipment 122 may include communication circuitry to receive and to transmit information with respect to one or more networks 125. Such information may include information associated with downhole equipment 124, which may be equipment to acquire information, to assist with resource recovery, etc. Other equipment 126 may be located remote from a well site and include sensing, detecting, emitting or other circuitry. Such equipment may include storage and communication circuitry to store and to communicate data, instructions, etc. As an example, one or more pieces of equipment may provide for measurement, collection, communication, storage, analysis, etc. of data (e.g., for one or more produced resources, etc.). As an example, one or more satellites may be provided for purposes of communications, data acquisition, etc. For example, FIG. 1 shows a satellite in communication with the network 125 that may be configured for communications, noting that the satellite may additionally or alternatively include circuitry for imagery (e.g., spatial, spectral, temporal, radiometric, etc.).

FIG. 1 also shows the geologic environment 120 as optionally including equipment 127 and 128 associated with a well that includes a substantially horizontal portion that may intersect with one or more fractures 129. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop the reservoir (e.g., via fracturing, injecting, extracting, etc.). As an example, the equipment 127 and/or 128 may include components, a system, systems, etc. for fracturing, seismic sensing, analysis of seismic data, assessment of one or more fractures, injection, production, etc. As an example, the equipment 127 and/or 128 may provide for measurement, collection, communication, storage, analysis, etc. of data such as, for example, production data (e.g., for one or more produced resources). As an example, one or more satellites may be provided for purposes of communications, data acquisition, etc.

FIG. 1 also shows an example of equipment 170 and an example of equipment 180. Such equipment, which may be systems of components, may be suitable for use in the geologic environment 120. While the equipment 170 and 180 are illustrated as land-based, various components may be suitable for use in an offshore system.

The equipment 170 includes a platform 171, a derrick 172, a crown block 173, a line 174, a traveling block assembly 175, drawworks 176 and a landing 177 (e.g., a monkeyboard). As an example, the line 174 may be controlled at least in part via the drawworks 176 such that the traveling block assembly 175 travels in a vertical direction with respect to the platform 171. For example, by drawing the line 174 in, the drawworks 176 may cause the line 174 to run through the crown block 173 and lift the traveling block assembly 175 skyward away from the platform 171; whereas, by allowing the line 174 out, the drawworks 176 may cause the line 174 to run through the crown block 173 and lower the traveling block assembly 175 toward the platform 171. Where the traveling block assembly 175 carries pipe (e.g., casing, etc.), tracking of movement of the traveling block 175 may provide an indication as to how much pipe has been deployed.

A derrick can be a structure used to support a crown block and a traveling block operatively coupled to the crown block at least in part via line. A derrick may be pyramidal in shape and offer a suitable strength-to-weight ratio. A derrick may be movable as a unit or in a piece by piece manner (e.g., to be assembled and disassembled).

As an example, drawworks may include a spool, brakes, a power source and assorted auxiliary devices. Drawworks may controllably reel out and reel in line. Line may be reeled over a crown block and coupled to a traveling block to gain mechanical advantage in a "block and tackle" or "pulley" fashion. Reeling out and in of line can cause a traveling block (e.g., and whatever may be hanging underneath it), to be lowered into or raised out of a bore. Reeling out of line may be powered by gravity and reeling in by a motor, an engine, etc. (e.g., an electric motor, a diesel engine, etc.).

As an example, a crown block can include a set of pulleys (e.g., sheaves) that can be located at or near a top of a derrick or a mast, over which line is threaded. A traveling block can include a set of sheaves that can be moved up and down in a derrick or a mast via line threaded in the set of sheaves of the traveling block and in the set of sheaves of a crown block. A crown block, a traveling block and a line can form a pulley system of a derrick or a mast, which may enable handling of heavy loads (e.g., drillstring, pipe, casing, liners, etc.) to be lifted out of or lowered into a bore. As an example, line may be about a centimeter to about five centimeters in diameter as, for example, steel cable. Through use of a set of sheaves, such line may carry loads heavier than the line could support as a single strand.

As an example, a derrickman may be a rig crew member that works on a platform attached to a derrick or a mast. A derrick can include a landing on which a derrickman may stand. As an example, such a landing may be about 10 meters or more above a rig floor. In an operation referred to as trip out of the hole (TOH), a derrickman may wear a safety harness that enables leaning out from the work landing (e.g., monkeyboard) to reach pipe in located at or near the center of a derrick or a mast and to throw a line around the pipe and pull it back into its storage location (e.g., fingerboards), for example, until it a time at which it may be desirable to run the pipe back into the bore. As an example, a rig may include automated pipe-handling equipment such that the derrickman controls the machinery rather than physically handling the pipe.

As an example, a trip may refer to the act of pulling equipment from a bore and/or placing equipment in a bore. As an example, equipment may include a drillstring that can be pulled out of a hole and/or placed or replaced in a hole. As an example, a pipe trip may be performed where a drill bit has dulled or has otherwise ceased to drill efficiently and is to be replaced.

FIG. 2 shows an example of a wellsite system 200 (e.g., at a wellsite that may be onshore or offshore). As shown, the wellsite system 200 can include a mud tank 201 for holding mud and other material (e.g., where mud can be a drilling fluid), a suction line 203 that serves as an inlet to a mud pump 204 for pumping mud from the mud tank 201 such that mud flows to a vibrating hose 206, a drawworks 207 for winching drill line or drill lines 212, a standpipe 208 that receives mud from the vibrating hose 206, a kelly hose 209 that receives mud from the standpipe 208, a gooseneck or goosenecks 210, a traveling block 211, a crown block 213 for carrying the traveling block 211 via the drill line or drill lines 212 (see, e.g., the crown block 173 of FIG. 1), a derrick 214 (see, e.g., the derrick 172 of FIG. 1), a kelly 218 or a top drive 240, a kelly drive bushing 219, a rotary table 220, a drill floor 221, a bell nipple 222, one or more blowout preventors (BOPs) 223, a drillstring 225, a drill bit 226, a casing head 227 and a flow pipe 228 that carries mud and other material to, for example, the mud tank 201.

In the example system of FIG. 2, a borehole 232 is formed in subsurface formations 230 by rotary drilling; noting that various example embodiments may also use directional drilling.

As shown in the example of FIG. 2, the drillstring 225 is suspended within the borehole 232 and has a drillstring assembly 250 that includes the drill bit 226 at its lower end.

As an example, the drillstring assembly 250 may be a bottom hole assembly (BHA).

The wellsite system 200 can provide for operation of the drillstring 225 and other operations. As shown, the wellsite system 200 includes the platform 211 and the derrick 214 positioned over the borehole 232. As mentioned, the wellsite system 200 can include the rotary table 220 where the drillstring 225 pass through an opening in the rotary table 220.

As shown in the example of FIG. 2, the wellsite system 200 can include the kelly 218 and associated components, etc., or a top drive 240 and associated components. As to a kelly example, the kelly 218 may be a square or hexagonal metal/alloy bar with a hole drilled therein that serves as a mud flow path. The kelly 218 can be used to transmit rotary motion from the rotary table 220 via the kelly drive bushing 219 to the drillstring 225, while allowing the drillstring 225 to be lowered or raised during rotation. The kelly 218 can pass through the kelly drive bushing 219, which can be driven by the rotary table 220. As an example, the rotary table 220 can include a master bushing that operatively couples to the kelly drive bushing 219 such that rotation of the rotary table 220 can turn the kelly drive bushing 219 and hence the kelly 218. The kelly drive bushing 219 can include an inside profile matching an outside profile (e.g., square, hexagonal, etc.) of the kelly 218; however, with slightly larger dimensions so that the kelly 218 can freely move up and down inside the kelly drive bushing 219.

As to a top drive example, the top drive 240 can provide functions performed by a kelly and a rotary table. The top drive 240 can turn the drillstring 225. As an example, the top drive 240 can include one or more motors (e.g., electric and/or hydraulic) connected with appropriate gearing to a short section of pipe called a quill, that in turn may be screwed into a saver sub or the drillstring 225 itself. The top drive 240 can be suspended from the traveling block 211, so the rotary mechanism is free to travel up and down the derrick 214. As an example, a top drive 240 may allow for drilling to be performed with more joint stands than a kelly/rotary table approach.

In the example of FIG. 2, the mud tank 201 can hold mud, which can be one or more types of drilling fluids. As an example, a wellbore may be drilled to produce fluid, inject fluid or both (e.g., hydrocarbons, minerals, water, etc.).

In the example of FIG. 2, the drillstring 225 (e.g., including one or more downhole tools) may be composed of a series of pipes threadably connected together to form a long tube with the drill bit 226 at the lower end thereof. As the drillstring 225 is advanced into a wellbore for drilling, at some point in time prior to or coincident with drilling, the mud may be pumped by the pump 204 from the mud tank 201 (e.g., or other source) via a the lines 206, 208 and 209 to a port of the kelly 218 or, for example, to a port of the top drive 240. The mud can then flow via a passage (e.g., or passages) in the drillstring 225 and out of ports located on the drill bit 226 (see, e.g., a directional arrow). As the mud exits the drillstring 225 via ports in the drill bit 226, it can then circulate upwardly through an annular region between an outer surface(s) of the drillstring 225 and surrounding wall(s) (e.g., open borehole, casing, etc.), as indicated by directional arrows. In such a manner, the mud lubricates the drill bit 226 and carries heat energy (e.g., frictional or other energy) and formation cuttings to the surface where the mud (e.g., and cuttings) may be returned to the mud tank 201, for example, for recirculation (e.g., with processing to remove cuttings, etc.).

The mud pumped by the pump 204 into the drillstring 225 may, after exiting the drillstring 225, form a mudcake that lines the wellbore which, among other functions, may reduce friction between the drillstring 225 and surrounding wall(s) (e.g., borehole, casing, etc.). A reduction in friction may facilitate advancing or retracting the drillstring 225. During a drilling operation, the entire drill string 225 may be pulled from a wellbore and optionally replaced, for example, with a new or sharpened drill bit, a smaller diameter drill string, etc. As mentioned, the act of pulling a drill string out of a hole or replacing it in a hole is referred to as tripping. A trip may be referred to as an upward trip or an outward trip or as a downward trip or an inward trip depending on trip direction.

As an example, consider a downward trip where upon arrival of the drill bit 226 of the drill string 225 at a bottom of a wellbore, pumping of the mud commences to lubricate the drill bit 226 for purposes of drilling to enlarge the wellbore. As mentioned, the mud can be pumped by the pump 204 into a passage of the drillstring 225 and, upon filling of the passage, the mud may be used as a transmission medium to transmit energy, for example, energy that may encode information as in mud-pulse telemetry.

As an example, mud-pulse telemetry equipment may include a downhole device configured to effect changes in pressure in the mud to create an acoustic wave or waves upon which information may modulated. In such an example, information from downhole equipment (e.g., one or more modules of the drillstring 225) may be transmitted uphole to an uphole device, which may relay such information to other equipment for processing, control, etc.

As an example, telemetry equipment may operate via transmission of energy via the drillstring 225 itself. For example, consider a signal generator that imparts coded energy signals to the drillstring 225 and repeaters that may receive such energy and repeat it to further transmit the coded energy signals (e.g., information, etc.).

As an example, the drillstring 225 may be fitted with telemetry equipment 252 that includes a rotatable drive shaft, a turbine impeller mechanically coupled to the drive shaft such that the mud can cause the turbine impeller to rotate, a modulator rotor mechanically coupled to the drive shaft such that rotation of the turbine impeller causes said modulator rotor to rotate, a modulator stator mounted adjacent to or proximate to the modulator rotor such that rotation of the modulator rotor relative to the modulator stator creates pressure pulses in the mud, and a controllable brake for selectively braking rotation of the modulator rotor to modulate pressure pulses. In such example, an alternator may be coupled to the aforementioned drive shaft where the alternator includes at least one stator winding electrically coupled to a control circuit to selectively short the at least one stator winding to electromagnetically brake the alternator and thereby selectively brake rotation of the modulator rotor to modulate the pressure pulses in the mud.

In the example of FIG. 2, an uphole control and/or data acquisition system 262 may include circuitry to sense pressure pulses generated by telemetry equipment 252 and, for example, communicate sensed pressure pulses or information derived therefrom for process, control, etc.

The assembly 250 of the illustrated example includes a logging-while-drilling (LWD) module 254, a measuring-while-drilling (MWD) module 256, an optional module 258, a roto-steerable system and motor 260, and the drill bit 226. Such components or modules may be referred to as tools where a drillstring can include a plurality of tools.

The LWD module 254 may be housed in a suitable type of drill collar and can contain one or a plurality of selected types of logging tools. It will also be understood that more than one LWD and/or MWD module can be employed, for example, as represented at by the module 256 of the drillstring assembly 250. Where the position of an LWD module is mentioned, as an example, it may refer to a module at the position of the LWD module 254, the module 256, etc. An LWD module can include capabilities for measuring, processing, and storing information, as well as for communicating with the surface equipment. In the illustrated example, the LWD module 254 may include a seismic measuring device.

The MWD module 256 may be housed in a suitable type of drill collar and can contain one or more devices for measuring characteristics of the drillstring 225 and the drill bit 226. As an example, the MWD tool 254 may include equipment for generating electrical power, for example, to power various components of the drillstring 225. As an example, the MWD tool 254 may include the telemetry equipment 252, for example, where the turbine impeller can generate power by flow of the mud; it being understood that other power and/or battery systems may be employed for purposes of powering various components. As an example, the MWD module 256 may include one or more of the following types of measuring devices: a weight-on-bit measuring device, a torque measuring device, a vibration measuring device, a shock measuring device, a stick slip measuring device, a direction measuring device, and an inclination measuring device.

FIG. 2 also shows some examples of types of holes that may be drilled. For example, consider a slant hole 272, an S-shaped hole 274, a deep inclined hole 276 and a horizontal hole 278.

As an example, a drilling operation can include directional drilling where, for example, at least a portion of a well includes a curved axis. For example, consider a radius that defines curvature where an inclination with regard to the vertical may vary until reaching an angle between about 30 degrees and about 60 degrees or, for example, an angle to about 90 degrees or possibly greater than about 90 degrees.

As an example, a directional well can include several shapes where each of the shapes may aim to meet particular operational demands. As an example, a drilling process may be performed on the basis of information as and when it is relayed to a drilling engineer. As an example, inclination and/or direction may be modified based on information received during a drilling process.

As an example, deviation of a bore may be accomplished in part by use of a downhole motor and/or a turbine. As to a motor, for example, a drillstring can include a positive displacement motor (PDM).

As an example, a system may be a steerable system and include equipment to perform a method such as geosteering. As an example, a steerable system can include a PDM or a turbine on a lower part of a drillstring which, just above a drill bit, a bent sub can be mounted. As an example, above a PDM, MWD equipment that provides real time or near real time data of interest (e.g., inclination, direction, pressure, temperature, real weight on the drill bit, torque stress, etc.) and/or LWD equipment may be installed. As to the latter, LWD equipment can make it possible to send to the surface various types of data of interest, including for example, geological data (e.g., gamma ray log, resistivity, density and sonic logs, etc.).

The coupling of sensors providing information on the course of a well trajectory, in real time or near real time, with, for example, one or more logs characterizing the formations from a geological viewpoint, can allow for implementing a geosteering method. Such a method can include navigating a subsurface environment, for example, to follow a desired route to reach a desired target or targets.

As an example, a drillstring can include an azimuthal density neutron (ADN) tool for measuring density and porosity; a MWD tool for measuring inclination, azimuth and shocks; a compensated dual resistivity (CDR) tool for measuring resistivity and gamma ray related phenomena; one or more variable gauge stabilizers; one or more bend joints; and a geosteering tool, which may include a motor and optionally equipment for measuring and/or responding to one or more of inclination, resistivity and gamma ray related phenomena.

As an example, geosteering can include intentional directional control of a wellbore based on results of downhole geological logging measurements in a manner that aims to keep a directional wellbore within a desired region, zone (e.g., a pay zone), etc. As an example, geosteering may include directing a wellbore to keep the wellbore in a particular section of a reservoir, for example, to minimize gas and/or water breakthrough and, for example, to maximize economic production from a well that includes the wellbore.

Referring again to FIG. 2, the wellsite system 200 can include one or more sensors 264 that are operatively coupled to the control and/or data acquisition system 262. As an example, a sensor or sensors may be at surface locations. As an example, a sensor or sensors may be at downhole locations. As an example, a sensor or sensors may be at one or more remote locations that are not within a distance of the order of about one hundred meters from the wellsite system 200. As an example, a sensor or sensor may be at an offset wellsite where the wellsite system 200 and the offset wellsite are in a common field (e.g., oil and/or gas field).

As an example, one or more of the sensors 264 can be provided for tracking pipe, tracking movement of at least a portion of a drillstring, etc.

As an example, the system 200 can include one or more sensors 266 that can sense and/or transmit signals to a fluid conduit such as a drilling fluid conduit (e.g., a drilling mud conduit). For example, in the system 200, the one or more sensors 266 can be operatively coupled to portions of the standpipe 208 through which mud flows. As an example, a downhole tool can generate pulses that can travel through the mud and be sensed by one or more of the one or more sensors 266. In such an example, the downhole tool can include associated circuitry such as, for example, encoding circuitry that can encode signals, for example, to reduce demands as to transmission. As an example, circuitry at the surface may include decoding circuitry to decode encoded information transmitted at least in part via mud-pulse telemetry. As an example, circuitry at the surface may include encoder circuitry and/or decoder circuitry and circuitry downhole may include encoder circuitry and/or decoder circuitry. As an example, the system 200 can include a transmitter that can generate signals that can be transmitted downhole via mud (e.g., drilling fluid) as a transmission medium.

As an example, one or more portions of a drillstring may become stuck. The term stuck can refer to one or more of varying degrees of inability to move or remove a drillstring from a bore. As an example, in a stuck condition, it might be possible to rotate pipe or lower it back into a bore or, for example, in a stuck condition, there may be an inability to move the drillstring axially in the bore, though some amount of rotation may be possible. As an example, in a stuck condition, there may be an inability to move at least a portion of the drillstring axially and rotationally.

As to the term "stuck pipe", this can refer to a portion of a drillstring that cannot be rotated or moved axially. As an example, a condition referred to as "differential sticking" can be a condition whereby the drillstring cannot be moved (e.g., rotated or reciprocated) along the axis of the bore. Differential sticking may occur when high-contact forces caused by low reservoir pressures, high wellbore pressures, or both, are exerted over a sufficiently large area of the drillstring. Differential sticking can have time and financial cost.

As an example, a sticking force can be a product of the differential pressure between the wellbore and the reservoir and the area that the differential pressure is acting upon. This means that a relatively low differential pressure (delta p) applied over a large working area can be just as effective in sticking pipe as can a high differential pressure applied over a small area.

As an example, a condition referred to as "mechanical sticking" can be a condition where limiting or prevention of motion of the drillstring by a mechanism other than differential pressure sticking occurs. Mechanical sticking can be caused, for example, by one or more of junk in the hole, wellbore geometry anomalies, cement, keyseats or a buildup of cuttings in the annulus.

Figure 3:
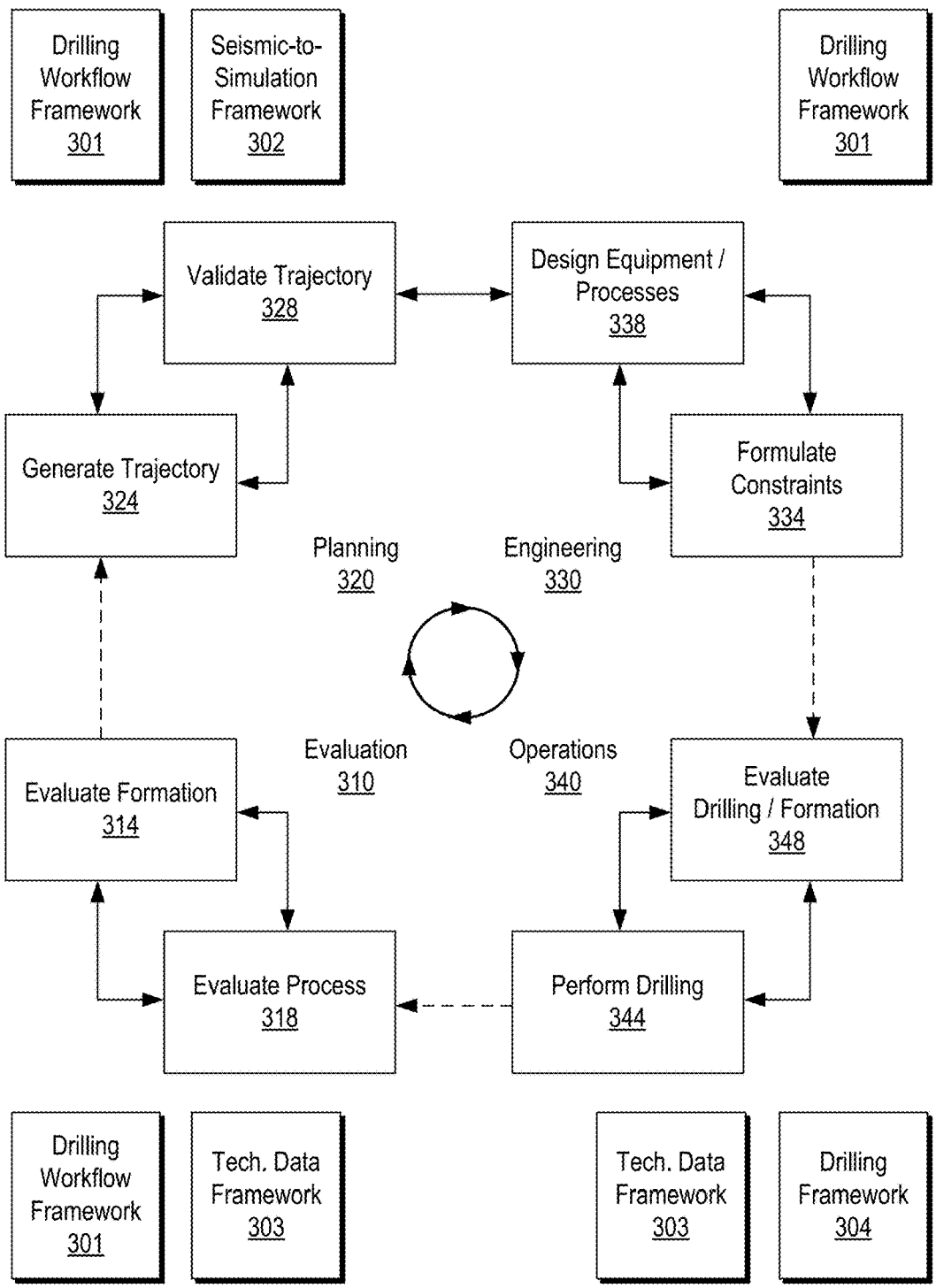
FIG. 3 illustrates an example of a system.

FIG. 3 shows an example of a system 300 that includes various equipment for evaluation 310, planning 320, engineering 330 and operations 340. For example, a drilling workflow framework 301, a seismic-to-simulation framework 302, a technical data framework 303 and a drilling framework 304 may be implemented to perform one or more processes such as a evaluating a formation 314, evaluating a process 318, generating a trajectory 324, validating a trajectory 328, formulating constraints 334, designing equipment and/or processes based at least in part on constraints 338, performing drilling 344 and evaluating drilling and/or formation 348.

In the example of FIG. 3, the seismic-to-simulation framework 302 can be, for example, the PETREL® framework (Schlumberger Limited, Houston, Tex.) and the technical data framework 303 can be, for example, the TECHLOG® framework (Schlumberger Limited, Houston, Tex.).

As an example, a framework can include entities that may include earth entities, geological objects or other objects such as wells, surfaces, reservoirs, etc. Entities can include virtual representations of actual physical entities that are reconstructed for purposes of one or more of evaluation, planning, engineering, operations, etc.

Entities may include entities based on data acquired via sensing, observation, etc. (e.g., seismic data and/or other information). An entity may be characterized by one or more properties (e.g., a geometrical pillar grid entity of an earth model may be characterized by a porosity property). Such properties may represent one or more measurements (e.g., acquired data), calculations, etc.

A framework may be an object-based framework. In such a framework, entities may include entities based on predefined classes, for example, to facilitate modeling, analysis, simulation, etc. An example of an object-based framework is the MICROSOFT™ .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

As an example, a framework can include an analysis component that may allow for interaction with a model or model-based results (e.g., simulation results, etc.). As to simulation, a framework may operatively link to or include a simulator such as the ECLIPSE® reservoir simulator (Schlumberger Limited, Houston Tex.), the INTERSECT® reservoir simulator (Schlumberger Limited, Houston Tex.), etc.

The aforementioned PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, well engineers, reservoir engineers, etc.) can develop collaborative workflows and integrate operations to streamline processes. Such a framework may be considered an application and may be considered a data-driven application (e.g., where data is input for purposes of modeling, simulating, etc.).

As an example, one or more frameworks may be interoperative and/or run upon one or another. As an example, consider the framework environment marketed as the OCEAN® framework environment (Schlumberger Limited, Houston, Tex.), which allows for integration of add-ons (or plug-ins) into a PETREL® framework workflow. The OCEAN® framework environment leverages .NET™ tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

As an example, a framework can include a model simulation layer along with a framework services layer, a framework core layer and a modules layer. The framework may include the OCEAN® framework where the model simulation layer can include or operatively link to the PETREL® model-centric software package that hosts OCEAN® framework applications. In an example embodiment, the PETREL® software may be considered a data-driven application. The PETREL® software can include a framework for model building and visualization. Such a model may include one or more grids.

As an example, the model simulation layer may provide domain objects, act as a data source, provide for rendering and provide for various user interfaces. Rendering may provide a graphical environment in which applications can display their data while the user interfaces may provide a common look and feel for application user interface components.

As an example, domain objects can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

As an example, data may be stored in one or more data sources (or data stores, generally physical data storage devices), which may be at the same or different physical sites and accessible via one or more networks. As an example, a model simulation layer may be configured to model projects. As such, a particular project may be stored where stored project information may include inputs, models, results and cases. Thus, upon completion of a modeling session, a user may store a project. At a later time, the project can be accessed and restored using the model simulation layer, which can recreate instances of the relevant domain objects.

As an example, the system 300 may be used to perform one or more workflows. A workflow may be a process that includes a number of worksteps. A workstep may operate on data, for example, to create new data, to update existing data, etc. As an example, a workflow may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable at least in part in the PETREL® software, for example, that operates on seismic data, seismic attribute(s), etc.

As an example, seismic data can be data acquired via a seismic survey where sources and receivers are positioned in a geologic environment to emit and receive seismic energy where at least a portion of such energy can reflect off subsurface structures. As an example, a seismic data analysis framework or frameworks (e.g., consider the OMEGA® framework, marketed by Schlumberger Limited, Houston, Tex.) may be utilized to determine depth, extent, properties, etc. of subsurface structures. As an example, seismic data analysis can include forward modeling and/or inversion, for example, to iteratively build a model of a subsurface region of a geologic environment. As an example, a seismic data analysis framework may be part of or operatively coupled to a seismic-to-simulation framework (e.g., the PETREL® framework, etc.).

As an example, a workflow may be a process implementable at least in part in the OCEAN® framework. As an example, a workflow may include one or more worksteps that access a module such as a plug-in (e.g., external executable code, etc.).

As an example, a framework may provide for modeling petroleum systems. For example, the modeling framework marketed as the PETROMOD® framework (Schlumberger Limited, Houston, Tex.) includes features for input of various types of information (e.g., seismic, well, geological, etc.) to model evolution of a sedimentary basin. The PETROMOD® framework provides for petroleum systems modeling via input of various data such as seismic data, well data and other geological data, for example, to model evolution of a sedimentary basin. The PETROMOD® framework may predict if, and how, a reservoir has been charged with hydrocarbons, including, for example, the source and timing of hydrocarbon generation, migration routes, quantities, pore pressure and hydrocarbon type in the subsurface or at surface conditions. In combination with a framework such as the PETREL® framework, workflows may be constructed to provide basin-to-prospect scale exploration solutions. Data exchange between frameworks can facilitate construction of models, analysis of data (e.g., PETROMOD® framework data analyzed using PETREL® framework capabilities), and coupling of workflows.

As mentioned, a drillstring can include various tools that may make measurements. As an example, a wireline tool or another type of tool may be utilized to make measurements.

As an example, a tool may be configured to acquire electrical borehole images. As an example, the fullbore Formation MicroImager (FMI) tool (Schlumberger Limited, Houston, Tex.) can acquire borehole image data. A data acquisition sequence for such a tool can include running the tool into a borehole with acquisition pads closed, opening and pressing the pads against a wall of the borehole, delivering electrical current into the material defining the borehole while translating the tool in the borehole, and sensing current remotely, which is altered by interactions with the material.

Analysis of formation information may reveal features such as, for example, vugs, dissolution planes (e.g., dissolution along bedding planes), stress-related features, dip events, etc. As an example, a tool may acquire information that may help to characterize a reservoir, optionally a fractured reservoir where fractures may be natural and/or artificial (e.g., hydraulic fractures). As an example, information acquired by a tool or tools may be analyzed using a framework such as the TECHLOG® framework. As an example, the TECHLOG® framework can be interoperable with one or more other frameworks such as, for example, the PETREL® framework.

As an example, various aspects of a workflow may be completed automatically, may be partially automated, or may be completed manually, as by a human user interfacing with a software application. As an example, a workflow may be cyclic, and may include, as an example, four stages such as, for example, an evaluation stage (see, e.g., the evaluation equipment 310), a planning stage (see, e.g., the planning equipment 320), an engineering stage (see, e.g., the engineering equipment 330) and an execution stage (see, e.g., the operations equipment 340). As an example, a workflow may commence at one or more stages, which may progress to one or more other stages (e.g., in a serial manner, in a parallel manner, in a cyclical manner, etc.).

As an example, a workflow can commence with an evaluation stage, which may include a geological service provider evaluating a formation (see, e.g., the evaluation block 314). As an example, a geological service provider may undertake the formation evaluation using a computing system executing a software package tailored to such activity; or, for example, one or more other suitable geology platforms may be employed (e.g., alternatively or additionally). As an example, the geological service provider may evaluate the formation, for example, using earth models, geophysical models, basin models, petrotechnical models, combinations thereof, and/or the like. Such models may take into consideration a variety of different inputs, including offset well data, seismic data, pilot well data, other geologic data, etc. The models and/or the input may be stored in the database maintained by the server and accessed by the geological service provider.

As an example, a workflow may progress to a geology and geophysics ("G&G") service provider, which may generate a well trajectory (see, e.g., the generation block 324), which may involve execution of one or more G&G software packages. Examples of such software packages include the PETREL® framework. As an example, a G&G service provider may determine a well trajectory or a section thereof, based on, for example, one or more model(s) provided by a formation evaluation (e.g., per the evaluation block 314), and/or other data, e.g., as accessed from one or more databases (e.g., maintained by one or more servers, etc.). As an example, a well trajectory may take into consideration various "basis of design" (BOD) constraints, such as general surface location, target (e.g., reservoir) location, and the like. As an example, a trajectory may incorporate information about tools, bottom-hole assemblies, casing sizes, etc., that may be used in drilling the well. A well trajectory determination may take into consideration a variety of other parameters, including risk tolerances, fluid weights and/or plans, bottom-hole pressures, drilling time, etc.

As an example, a workflow may progress to a first engineering service provider (e.g., one or more processing machines associated therewith), which may validate a well trajectory and, for example, relief well design (see, e.g., the validation block 328). Such a validation process may include evaluating physical properties, calculations, risk tolerances, integration with other aspects of a workflow, etc. As an example, one or more parameters for such determinations may be maintained by a server and/or by the first engineering service provider; noting that one or more model(s), well trajectory(ies), etc. may be maintained by a server and accessed by the first engineering service provider. For example, the first engineering service provider may include one or more computing systems executing one or more software packages. As an example, where the first engineering service provider rejects or otherwise suggests an adjustment to a well trajectory, the well trajectory may be adjusted or a message or other notification sent to the G&G service provider requesting such modification.

As an example, one or more engineering service providers (e.g., first, second, etc.) may provide a casing design, bottom-hole assembly (BHA) design, fluid design, and/or the like, to implement a well trajectory (see, e.g., the design block 338). In some embodiments, a second engineering service provider may perform such design using one of more software applications. Such designs may be stored in one or more databases maintained by one or more servers, which may, for example, employ STUDIO® framework tools, and may be accessed by one or more of the other service providers in a workflow.

As an example, a second engineering service provider may seek approval from a third engineering service provider for one or more designs established along with a well trajectory. In such an example, the third engineering service provider may consider various factors as to whether the well engineering plan is acceptable, such as economic variables (e.g., oil production forecasts, costs per barrel, risk, drill time, etc.), and may request authorization for expenditure, such as from the operating company's representative, well-owner's representative, or the like (see, e.g., the formulation block 334). As an example, at least some of the data upon which such determinations are based may be stored in one or more database maintained by one or more servers. As an example, a first, a second, and/or a third engineering service provider may be provided by a single team of engineers or even a single engineer, and thus may or may not be separate entities.

As an example, where economics may be unacceptable or subject to authorization being withheld, an engineering service provider may suggest changes to casing, a bottom-hole assembly, and/or fluid design, or otherwise notify and/or return control to a different engineering service provider, so that adjustments may be made to casing, a bottom-hole assembly, and/or fluid design. Where modifying one or more of such designs is impracticable within well constraints, trajectory, etc., the engineering service provider may suggest an adjustment to the well trajectory and/or a workflow may return to or otherwise notify an initial engineering service provider and/or a G&G service provider such that either or both may modify the well trajectory.

As an example, a workflow can include considering a well trajectory, including an accepted well engineering plan, and a formation evaluation. Such a workflow may then pass control to a drilling service provider, which may implement the well engineering plan, establishing safe and efficient drilling, maintaining well integrity, and reporting progress as well as operating parameters (see, e.g., the blocks 344 and 348). As an example, operating parameters, formation encountered, data collected while drilling (e.g., using logging-while-drilling or measuring-while-drilling technology), may be returned to a geological service provider for evaluation. As an example, the geological service provider may then re-evaluate the well trajectory, or one or more other aspects of the well engineering plan, and may, in some cases, and potentially within predetermined constraints, adjust the well engineering plan according to the real-life drilling parameters (e.g., based on acquired data in the field, etc.).

Whether the well is entirely drilled, or a section thereof is completed, depending on the specific embodiment, a workflow may proceed to a post review (see, e.g., the evaluation block 318). As an example, a post review may include reviewing drilling performance. As an example, a post review may further include reporting the drilling performance (e.g., to one or more relevant engineering, geological, or G&G service providers).

Various activities of a workflow may be performed consecutively and/or may be performed out of order (e.g., based partially on information from templates, nearby wells, etc. to fill in any gaps in information that is to be provided by another service provider). As an example, undertaking one activity may affect the results or basis for another activity, and thus may, either manually or automatically, call for a variation in one or more workflow activities, work products, etc. As an example, a server may allow for storing information on a central database accessible to various service providers where variations may be sought by communication with an appropriate service provider, may be made automatically, or may otherwise appear as suggestions to the relevant service provider. Such an approach may be considered to be a holistic approach to a well workflow, in comparison to a sequential, piecemeal approach.

As an example, various actions of a workflow may be repeated multiple times during drilling of a wellbore. For example, in one or more automated systems, feedback from a drilling service provider may be provided at or near real-time, and the data acquired during drilling may be fed to one or more other service providers, which may adjust its piece of the workflow accordingly. As there may be dependencies in other areas of the workflow, such adjustments may permeate through the workflow, e.g., in an automated fashion. In some embodiments, a cyclic process may additionally or instead proceed after a certain drilling goal is reached, such as the completion of a section of the wellbore, and/or after the drilling of the entire wellbore, or on a per-day, week, month, etc. basis.

Well planning can include determining a path of a well that can extend to a reservoir, for example, to economically produce fluids such as hydrocarbons therefrom. Well planning can include selecting a drilling and/or completion assembly which may be used to implement a well plan. As an example, various constraints can be imposed as part of well planning that can impact design of a well. As an example, such constraints may be imposed based at least in part on information as to known geology of a subterranean domain, presence of one or more other wells (e.g., actual and/or planned, etc.) in an area (e.g., consider collision avoidance), etc. As an example, one or more constraints may be imposed based at least in part on characteristics of one or more tools, components, etc. As an example, one or more constraints may be based at least in part on factors associated with drilling time and/or risk tolerance.

As an example, a system can allow for a reduction in waste, for example, as may be defined according to LEAN. In the context of LEAN, consider one or more of the following types of waste: transport (e.g., moving items unnecessarily, whether physical or data); inventory (e.g., components, whether physical or informational, as work in process, and finished product not being processed); motion (e.g., people or equipment moving or walking unnecessarily to perform desired processing); waiting (e.g., waiting for information, interruptions of production during shift change, etc.); overproduction (e.g., production of material, information, equipment, etc. ahead of demand); over Processing (e.g., resulting from poor tool or product design creating activity); and defects (e.g., effort involved in inspecting for and fixing defects whether in a plan, data, equipment, etc.). As an example, a system that allows for actions (e.g., methods, workflows, etc.) to be performed in a collaborative manner can help to reduce one or more types of waste.

As an example, a system can be utilized to implement a method for facilitating distributed well engineering, planning, and/or drilling system design across multiple computation devices where collaboration can occur among various different users (e.g., some being local, some being remote, some being mobile, etc.). In such a system, the various users via appropriate devices may be operatively coupled via one or more networks (e.g., local and/or wide area networks, public and/or private networks, land-based, marine-based and/or areal networks, etc.).

As an example, a system may allow well engineering, planning, and/or drilling system design to take place via a subsystems approach where a wellsite system is composed of various subsystem, which can include equipment subsystems and/or operational subsystems (e.g., control subsystems, etc.). As an example, computations may be performed using various computational platforms/devices that are operatively coupled via communication links (e.g., network links, etc.). As an example, one or more links may be operatively coupled to a common database (e.g., a server site, etc.). As an example, a particular server or servers may manage receipt of notifications from one or more devices and/or issuance of notifications to one or more devices. As an example, a system may be implemented for a project where the system can output a well plan, for example, as a digital well plan, a paper well plan, a digital and paper well plan, etc. Such a well plan can be a complete well engineering plan or design for the particular project.

Figure 4:
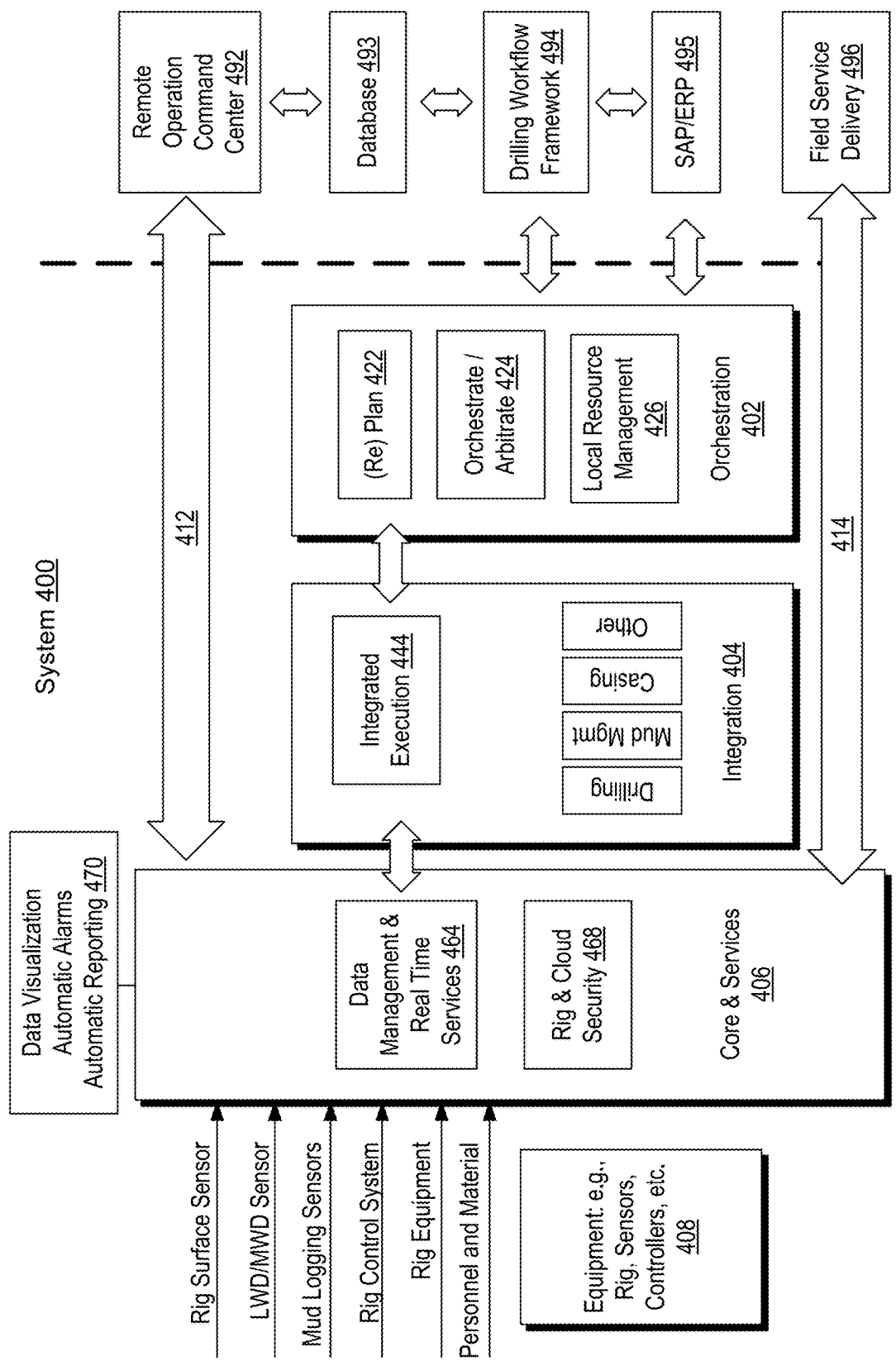
FIG. 4 illustrates an example of a system.

FIG. 4 shows an example of a system 400 that includes various components that can be local to a wellsite and includes various components that can be remote from a wellsite. As shown, the system 400 includes an orchestration block 402, an integration block 404, a core and services block 406 and an equipment block 408. These blocks can be labeled in one or more manners other than as shown in the example of FIG. 4. In the example of FIG. 4, the blocks 402, 404, 406 and 408 can be defined by one or more of operational features, functions, relationships in an architecture, etc.

As an example, the blocks 402, 404, 406 and 408 may be described in a pyramidal architecture where, from peak to base, a pyramid includes the orchestration block 402, the integration block 404, the core and services block 406 and the equipment block 408.

As an example, the orchestration block 402 can be associated with a well management level (e.g., well planning and/or orchestration) and can be associated with a rig management level (e.g., rig dynamic planning and/or orchestration). As an example, the integration block 404 can be associated with a process management level (e.g., rig integrated execution). As an example, the core and services block 406 can be associated with a data management level (e.g., sensor, instrumentation, inventory, etc.). As an example, the equipment block 408 can be associated with a wellsite equipment level (e.g., wellsite subsystems, etc.).

As an example, the orchestration block 402 may receive information from a drilling workflow framework and/or one or more other sources, which may be remote from a wellsite.

In the example of FIG. 4, the orchestration block 402 includes a plan/replan block 422, an orchestrate/arbitrate block 424 and a local resource management block 426. In the example of FIG. 4, the integration block 404 includes an integrated execution block 444, which can include or be operatively coupled to blocks for various subsystems of a wellsite such as a drilling subsystem, a mud management subsystem (e.g., a hydraulics subsystem), a casing subsystem (e.g., casings and/or completions subsystem), and, for example, one or more other subsystems. In the example of FIG. 4, the core and services block 406 includes a data management and real-time services block 464 (e.g., real-time or near real-time services) and a rig and cloud security block 468 (e.g., as to provisioning and various type of security measures, etc.). In the example of FIG. 4, the equipment block 408 is shown as being capable of providing various types of information to the core and services block 406. For example, consider information from a rig surface sensor, a LWD/MWD sensor, a mud logging sensor, a rig control system, rig equipment, personnel, material, etc. In the example, of FIG. 4, a block 470 can provide for one or more of data visualization, automatic alarms, automatic reporting, etc. As an example, the block 470 may be operatively coupled to the core and services block 406 and/or one or more other blocks.

As mentioned, a portion of the system 400 can be remote from a wellsite. For example, to one side of a dashed line appear a remote operation command center block 492, a database block 493, a drilling workflow framework block 494, a SAP/ERP block 495 and a field services delivery block 496. Various blocks that may be remote can be operatively coupled to one or more blocks that may be local to a wellsite system. For example, a communication link 412 is illustrated in the example of FIG. 4 that can operatively couple the blocks 406 and 492 (e.g., as to monitoring, remote control, etc.), while another communication link 414 is illustrated in the example of FIG. 4 that can operatively couple the blocks 406 and 496 (e.g., as to equipment delivery, equipment services, etc.). Various other examples of possible communication links are also illustrated in the example of FIG. 4.

As an example, the system 400 of FIG. 4 may be a field management tool. As an example, the system 400 of FIG. 4 may include a drilling framework (see, e.g., the drilling framework 304). As an example, blocks in the system 400 of FIG. 4 that may be remote from a wellsite.

As an example, a wellbore can be drilled according to a drilling plan that is established prior to drilling. Such a drilling plan, which may be a well plan or a portion thereof, can set forth equipment, pressures, trajectories and/or other parameters that define drilling process for a wellsite. As an example, a drilling operation may then be performed according to the drilling plan (e.g., well plan). As an example, as information is gathered, a drilling operation may deviate from a drilling plan. Additionally, as drilling or other operations are performed, subsurface conditions may change. Specifically, as new information is collected, sensors may transmit data to one or more surface units. As an example, a surface unit may automatically use such data to update a drilling plan (e.g., locally and/or remotely).

As an example, the drilling workflow framework 494 can be or include a G&G system and a well planning system. As an example, a G&G system corresponds to hardware, software, firmware, or a combination thereof that provides support for geology and geophysics. In other words, a geologist who understands the reservoir may decide where to drill the well using the G&G system that creates a three-dimensional model of the subsurface formation and includes simulation tools. The G&G system may transfer a well trajectory and other information selected by the geologist to a well planning system. The well planning system corresponds to hardware, software, firmware, or a combination thereof that produces a well plan. In other words, the well plan may be a high-level drilling program for the well. The well planning system may also be referred to as a well plan generator.

In the example of FIG. 4, various blocks can be components that may correspond to one or more software modules, hardware infrastructure, firmware, equipment, or any combination thereof. Communication between the components may be local or remote, direct or indirect, via application programming interfaces, and procedure calls, or through one or more communication channels.

As an example, various blocks in the system 400 of FIG. 4 can correspond to levels of granularity in controlling operations of associated with equipment and/or personnel in an oilfield. As shown in FIG. 4, the system 400 can include the orchestration block 402 (e.g., for well plan execution), the integration block 404 (e.g., process manager collection), the core and services block 406, and the equipment block 408.

The orchestration block 402 may be referred to as a well plan execution system. For example, a well plan execution system corresponds to hardware, software, firmware or a combination thereof that performs an overall coordination of the well construction process, such as coordination of a drilling rig and the management of the rig and the rig equipment. A well plan execution system may be configured to obtain the general well plan from well planning system and transform the general well plan into a detailed well plan. The detailed well plan may include a specification of the activities involved in performing an action in the general well plan, the days and/or times to perform the activities, the individual resources performing the activities, and other information.

As an example, a well plan execution system may further include functionality to monitor an execution of a well plan to track progress and dynamically adjust the plan. Further, a well plan execution system may be configured to handle logistics and resources with respect to on and off the rig. As an example, a well plan execution system may include multiple sub-components, such as a detailer that is configured to detail the well planning system plan, a monitor that is configured to monitor the execution of the plan, a plan manager that is configured to perform dynamic plan management, and a logistics and resources manager to control the logistics and resources of the well. In one or more embodiments, a well plan execution system may be configured to coordinate between the different processes managed by a process manager collection (see, e.g., the integration block 404). In other words, a well plan execution system can communicate and manage resource sharing between processes in a process manager collection while operating at, for example, a higher level of granularity than process manager collection.

As to the integration block 404, as mentioned, it may be referred to as a process manager collection. In one or more embodiments, a process manager collection can include functionality to perform individual process management of individual domains of an oilfield, such as a rig. For example, when drilling a well, different activities may be performed. Each activity may be controlled by an individual process manager in the process manager collection. A process manager collection may include multiple process managers, whereby each process manager controls a different activity (e.g., activity related to the rig). In other words, each process manager may have a set of tasks defined for the process manager that is particular to the type of physics involved in the activity. For example, drilling a well may use drilling mud, which is fluid pumped into well in order to extract drill cuttings from the well. A drilling mud process manager may exist in a process manager collection that manages the mixing of the drilling mud, the composition, testing of the drilling mud properties, determining whether the pressure is accurate, and performing other such tasks. The drilling mud process manager may be separate from a process manager that controls movement of drill pipe from a well. Thus, a process manager collection may partition activities into several different domains and manages each of the domains individually. Amongst other possible process managers, a process manager collection may include, for example, a drilling process manager, a mud preparation and management process manager, a casing running process manager, a cementing process manager, a rig equipment process manager, and other process managers. Further, a process manager collection may provide direct control or advice regarding the components above. As an example, coordination between process managers in a process manager collection may be performed by a well plan execution system.

As to the core and services block 406 (e.g., CS block), it can include functionality to manage individual pieces of equipment and/or equipment subsystems. As an example, a CS block can include functionality to handle basic data structure of the oilfield, such as the rig, acquire metric data, produce reports, and manages resources of people and supplies. As an example, a CS block may include a data acquirer and aggregator, a rig state identifier, a real-time (RT) drill services (e.g., near real-time), a reporter, a cloud, and an inventory manager.

As an example, a data acquirer and aggregator can include functionality to interface with individual equipment components and sensor and acquire data. As an example, a data acquirer and aggregator may further include functionality to interface with sensors located at the oilfield.

As an example, a rig state identifier can includes functionality to obtain data from the data acquirer and aggregator and transform the data into state information. As an example, state information may include health and operability of a rig as well as information about a particular task being performed by equipment.

As an example, RT drill services can include functionality to transmit and present information to individuals. In particular, the RT drill services can include functionality to transmit information to individuals involved according to roles and, for example, device types of each individual (e.g., mobile, desktop, etc.). In one or more embodiments, information presented by RT drill services can be context specific, and may include a dynamic display of information so that a human user may view details about items of interest.

As an example, in one or more embodiments, a reporter can include functionality to generate reports. For example, reporting may be based on requests and/or automatic generation and may provide information about state of equipment and/or people.

As an example, a wellsite "cloud" framework can correspond to an information technology infrastructure locally at an oilfield, such as an individual rig in the oilfield. In such an example, the wellsite "cloud" framework may be an "Internet of Things" (IoT) framework. As an example, a wellsite "cloud" framework can be an edge of the cloud (e.g., a network of networks) or of a private network.

As an example, an inventory manager can be a block that includes functionality to manage materials, such as a list and amount of each resource on a rig.

In the example of FIG. 4, the equipment block 408 can correspond to various controllers, control unit, control equipment, etc. that may be operatively coupled to and/or embedded into physical equipment at a wellsite such as, for example, rig equipment. For example, the equipment block 408 may correspond to software and control systems for individual items on the rig. As an example, the equipment block 408 may provide for monitoring sensors from multiple subsystems of a drilling rig and provide control commands to multiple subsystem of the drilling rig, such that sensor data from multiple subsystems may be used to provide control commands to the different subsystems of the drilling rig and/or other devices, etc.

For example, a system may collect temporally and depth aligned surface data and downhole data from a drilling rig and transmit the collected data to data acquirers and aggregators in core services, which can store the collected data for access onsite at a drilling rig or offsite via a computing resource environment.

As mentioned, the system 400 of FIG. 4 can be associated with a plan where, for example, the plan/replan block 422 can provide for planning and/or re-planning one or more operations, etc.

Figure 5:
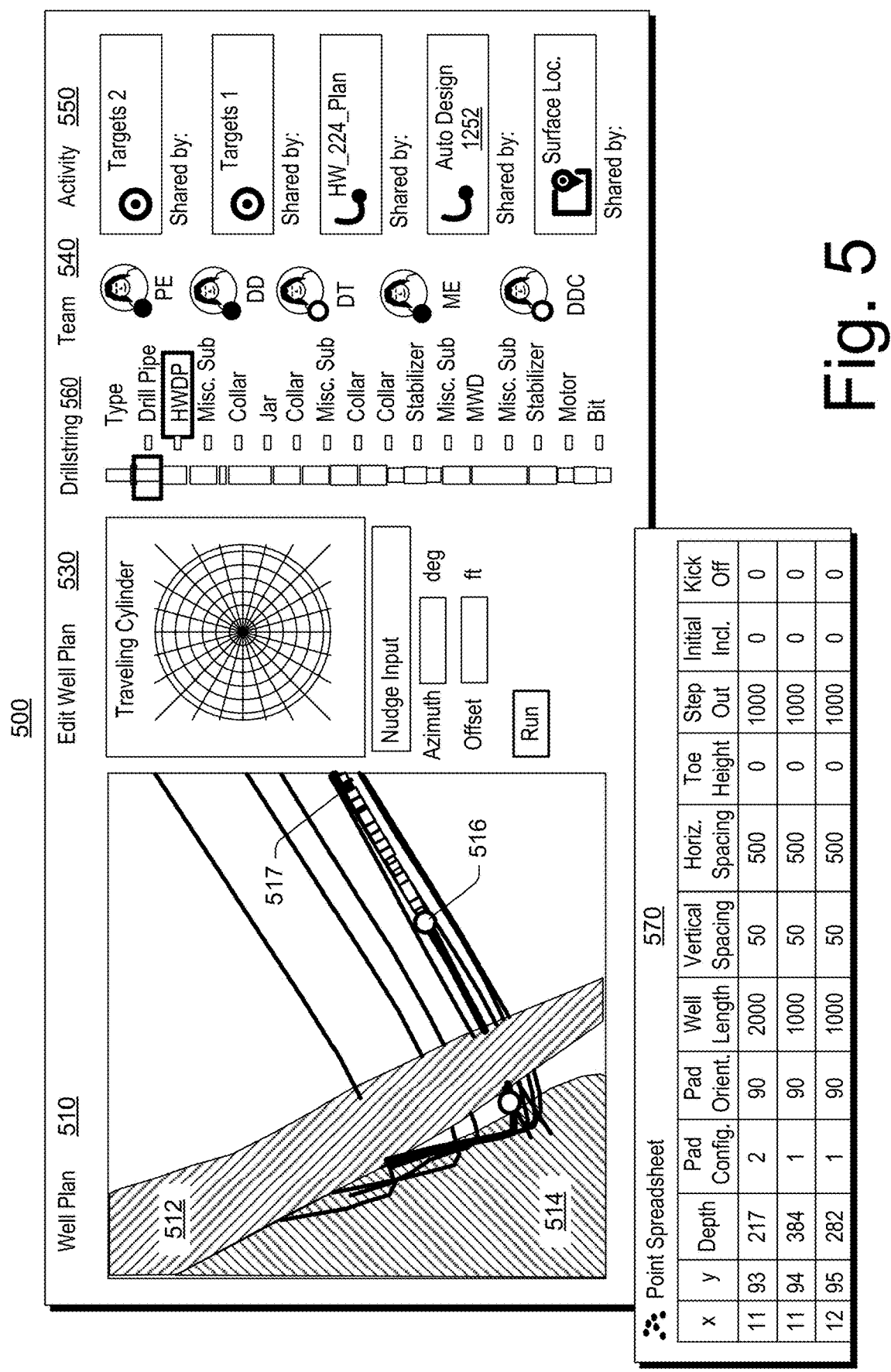
FIG. 5 illustrates an example of a graphical user interface.

FIG. 5 shows an example of a graphical user interface (GUI) 500 that includes information associated with a well plan. Specifically, the GUI 500 includes a panel 510 where surfaces representations 512 and 514 are rendered along with well trajectories where a location 516 can represent a position of a drillstring 517 along a well trajectory. The GUI 500 may include one or more editing features such as an edit well plan set of features 530. The GUI 500 may include information as to individuals of a team 540 that are involved, have been involved and/or are to be involved with one or more operations. The GUI 500 may include information as to one or more activities 550. As shown in the example of FIG. 5, the GUI 500 can include a graphical control of a drillstring 560 where, for example, various portions of the drillstring 560 may be selected to expose one or more associated parameters (e.g., type of equipment, equipment specifications, operational history, etc.). FIG. 5 also shows a table 570 as a point spreadsheet that specifies information for a plurality of wells.

Figure 6:
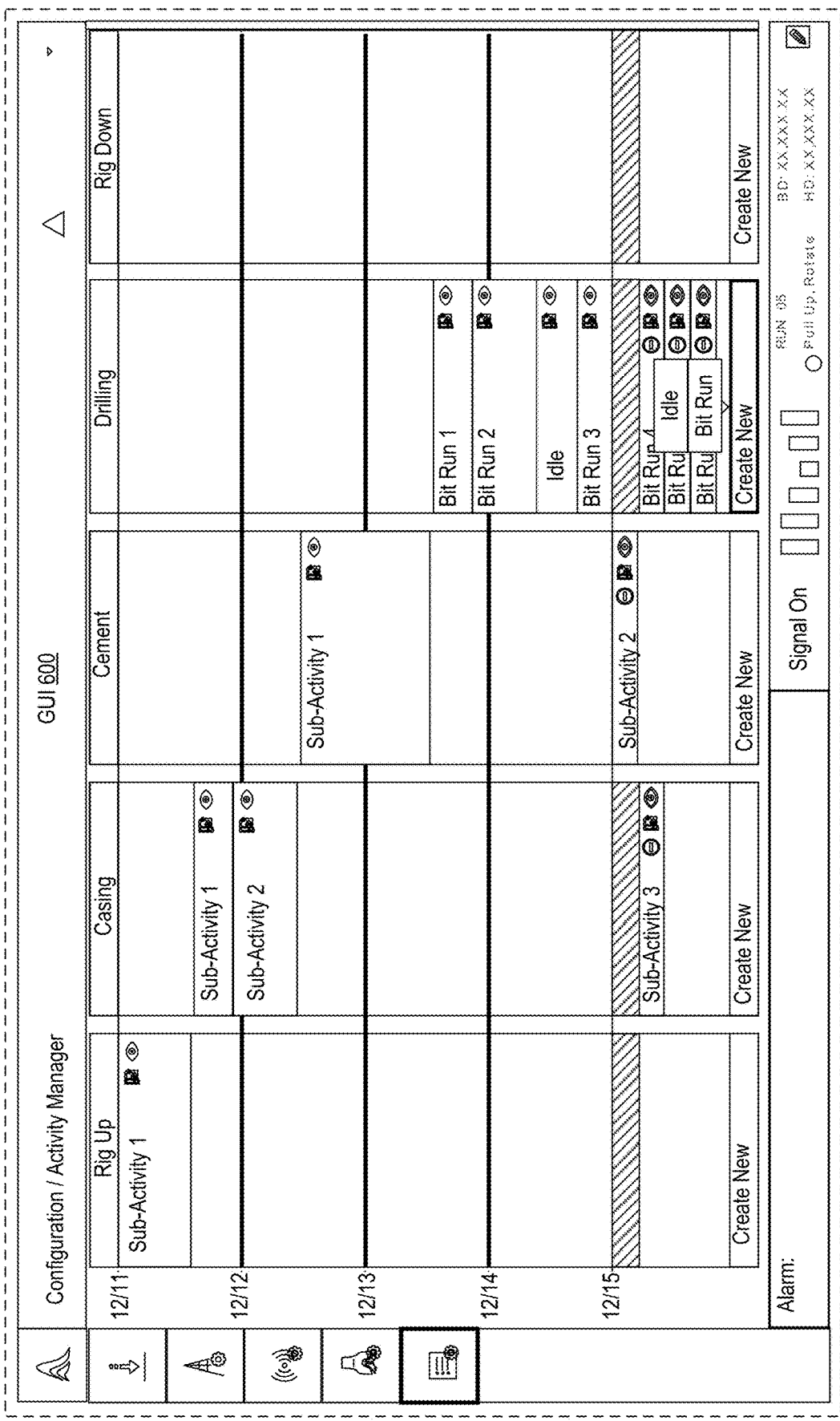
FIG. 6 illustrates an example of a graphical user interface.

FIG. 6 shows an example of a graphical user interface (GUI) 600 that includes a calendar with dates for various operations that can be part of a plan. For example, the GUI 600 shows rig up, casing, cement, drilling and rig down operations that can occur over various periods of time. Such a GUI may be editable via selection of one or more graphical controls.

As an example, a computational framework can include one or more machine learning models for field operations associated with a dynamic system, which can include equipment and environment (e.g., rigsite equipment and a subterranean environment, which may be referred to as a formation). Such a framework can be utilized for control of one or more field operations. For example, consider a computational framework that is operatively coupled to one or more pieces of field equipment for control of one or more drilling operations.

As an example, a field controller can be calibrated using data generated by one or more machine learning models of a computational framework. Such data may be referred to as synthetic data that represents actual field operations. As an example, such data may be drilling time series data. A computational framework that generates such synthetic data can be referred to as a computational simulator, which is a type of device or system, which may be consolidated or distributed. For example, a computational simulator can be a device or a system that includes one or more processors and memory where circuitry thereof is specialized (e.g., via configuration by processor-executable instructions stored in the memory) to generate synthetic data that represents actual field operations. As an example, a method can utilize synthetic data for one or more purposes such as, for example, calibration of a field controller to generate a calibrated field controller (e.g., via tuning, etc.), testing of a field controller, etc. As an example, a computational framework that can generate synthetic data representative of one or more field operations can be utilized to infer one or more states of a one or more drilling operations, optionally in real time. For example, channels of real time drilling operation data can be received and characterized using generated synthetic data, which may be generated based at least in part on one or more operational parameters associated with the real time drilling operation.

As an example, a computational simulator (e.g., or simulator) can include components that generate the "warts" of real data (e.g., noise, gaps, etc.) in synthetic data; noting that heterogeneous data or representations based on heterogeneous data may be generated as output that are, or are based on, a combination of real data and synthetic data.

As an example, a simulator can learn from real data, characterize different drilling responses and conditions using a deep neural network (DNN). Such a simulator can generate realistic drilling time series (e.g., multi-channel drilling time series data). For example, when presented with such realistic drilling time series, an expert in the field of oilfield drilling may be unable to discern whether various portions of the synthetic data generated by the simulator are real or machine model-based (e.g., output by a simulator).

As an example, to simulate drilling time series, a DNN can model physical properties of a formation, a rig, and sensors, and generate data with realistic curve patterns when the DNN is trained on real measurements, which can be multi-channel sensor data time series, which may include, for example, one or more of block position, hookload, standpipe pressure, and surface torque.

A block, as associated with field equipment, can be a set of pulleys used to gain mechanical advantage in lifting or dragging heavy objects. There can be two blocks on a drilling rig, the crown block and the traveling block. Each can include several sheaves that are rigged with steel drilling cable or line such that the traveling block may be raised (or lowered) by reeling in (or out) a spool of drilling line on the drawworks. As such, block position can refer to the position of the traveling block, which can vary with respect to time. FIG. 1 shows a traveling block assembly 175 and FIG. 2 shows a traveling block 211.

A hook can be high-capacity J-shaped equipment used to hang various equipment such as a swivel and kelly, elevator bails, or a topdrive unit (see, e.g., various equipment of FIG. 2). As shown in FIG. 2, a hook can be attached to the bottom of the traveling block 211 (e.g., part of the traveling block assembly 175 of FIG. 1) and provide a way to pick up heavy loads with the traveling block 211. The hook may be either locked (e.g., a normal condition) or free to rotate, so that it may be mated or decoupled with items positioned around the rig floor, etc.

Hookload can be the total force pulling down on a hook as carried by a traveling block. The total force includes the weight of the drillstring in air, the drill collars and any ancillary equipment, reduced by forces that tend to reduce that weight. Some forces that might reduce the weight include friction along a bore wall (especially in deviated wells) and buoyant forces on a drillstring caused by its immersion in drilling fluid (e.g., and/or other fluid). If a blowout preventer (BOP) (e.g., or BOPs) is closed, pressure in a bore acting on cross-sectional area of a drillstring in the BOP can also exert an upward force.

A standpipe can be a rigid metal conduit that provides a high-pressure pathway for drilling fluid to travel approximately one-third of the way up the derrick, where it connects to a flexible high-pressure hose (e.g., kelly hose). A large rig may be fitted with more than one standpipe so that downtime is kept to a minimum if one standpipe demands repair. FIG. 2 shows the standpipe 208 as being a conduit for drilling fluid (e.g., drilling mud, etc.). Pressure of fluid within the standpipe 208 can be referred to as standpipe pressure.

As to surface torque, such a measurement can be provided by equipment at a rig site. As an example, one or more sensors can be utilized to measure surface torque, which may provide for direct and/or indirect measurement of surface torque associated with a drillstring. As an example, equipment can include a drill pipe torque measurement and controller system with one or more of analog frequency output and digital output. As an example, a torque sensor may be associated with a coupling that includes a resilient element operatively joining an input element and an output element where the resilient element allows the input and output elements to twist with respect to one another in response to torque being transmitted through the torque sensor where the twisting can be measured and used to determine the torque being transmitted. As an example, such a coupling can be located between a drive and drill pipe. As an example, torque may be determined via an inertia sensor or sensors. As an example, equipment at a rig site can include one or more sensors for measurement and/or determination of torque (e.g., in units of Nm, etc.).

As an example, equipment can include a real-time drilling service system that may provide data such as weight transfer information, torque transfer information, equivalent circulation density (ECD) information, downhole mechanical specific energy (DMSE) information, motion information (e.g., as to stall, stick-slip, etc.), bending information, vibrational amplitude information (e.g., axial, lateral and/or torsional), rate of penetration (ROP) information, pressure information, differential pressure information, flow information, etc. As an example, sensor information may include inclination, azimuth, total vertical depth, etc. As an example, a system may provide information as to whirl (e.g., backward whirl, etc.) and may optionally provide information such as one or more alerts (e.g., "severe backward whirl: stop and restart with lower surface RPM", etc.).

As an example, a drillstring can include a tool or tools that include various sensors that can make various measurements. For example, consider the OPTIDRILL™ tool (Schlumberger Limited, Houston, Tex.), which includes strain gauges, accelerometers, magnetometer(s), gyroscope(s), etc. For example, such a tool can acquire weight on bit measurements (WOB) using a strain gauge (e.g., 10 second moving window with bandwidth of 200 Hz), torque measurements using a strain gauge (e.g., 10 second moving window with bandwidth of 200 Hz), bending moment using a strain gauge (e.g., 10 second moving window with bandwidth of 200 Hz), vibration using one or more accelerometers (e.g., 30 second RMS with bandwidth of 0.2 to 150 Hz), rotational speed using a magnetometer and a gyroscope (e.g., 30 moving window with bandwidth of 4 Hz), annular and internal pressures using one or more strain gauges (e.g., 1 second average with bandwidth of 200 Hz), annular and internal temperatures using one or more temperature sensors (1 second average with bandwidth of 10 Hz), and continuous inclination using an accelerometer (30 second average with bandwidth of 10 Hz).

As mentioned, channels of real time drilling operation data can be received and characterized using generated synthetic data, which may be generated based at least in part on one or more operational parameters associated with the real time drilling operation. Such real time drilling operation data can include surface data and/or downhole data. As mentioned, data availability may differ temporally (e.g., frequency, gaps, etc.) and/or otherwise (e.g., resolution, etc.). Such data may differ as to noise level and/or noise characteristics.

As an example, a computational framework can include a neural network model that includes multiple convolutional, recurrent, and fully-connected layers, which can include components, which may be referred to as units. Such a model can be trained with wellsite/rigsite data. Such a model can be trained to capture spatio-temporal distributions among data channels and then use a windowed input to predict next data points, which can then be fed back into the model to generate a simulated data sequence recursively.

A neural network model can be a deep neural network (DNN) model (or simply deep neural network, DNN). A DNN can be fed with real sensor drilling time series data of various channels (e.g., training data, real time data, etc.). Such a DNN can include, for example, eight convolutional layers with three max-pooling layers, three recurrent layers, and four fully-connected layers. As an example, a time window used for input can include 512 samples for each channel of a number of channels, while output can be, for example, 1 sample for each channel.

In various trials, training of the aforementioned DNN was accomplished using two hundred epochs. The generated trained DNN successfully simulated time series data recursively. The simulated time series preserved features of the training data while maintaining the data distribution of multiple channels. For example, the output simulated time series data (e.g., synthetic data) exhibited a consistent "in slips" pattern in the hookload channel when block position moved quickly from bottom to top.

For example, as to slips, which are an assembly that can be used to grip a drillstring in a relatively non-damaging manner and suspend the drillstring in a rotary table, data in the well-site information transfer specification or standard (WITS) and markup language (WITSML) (e.g., or other specification(s)) can define operations such as "bottom to slips" time as a time interval between coming off bottom and setting slips, for a current connection; "in slips" as a time interval between setting the slips and then releasing them, for a current connection; and "slips to bottom" as a time interval between releasing the slips and returning to bottom (e.g., setting weight on the bit), for a current connection. As such, "in slips" is associated with a time between setting and releasing that can be seen in data such as hookload and block position.

As an example, a DNN can be a relatively robust model that can simulate drilling time series with complex spatio-temporal patterns. Such a DNN can be part of a specialized simulator of drilling time series datasets that model non-trivial physics laws and properties, including formation characteristics/behaviors, rig characteristics/behaviors, and sensors information/characteristics/behaviors, and generate data with realistic "curve" patterns. Such a simulator can be implemented to improve an inference component of an automation system (e.g., control system), for example, via the enrichment of datasets that are available for one or more purposes (e.g., testing, calibration, comparison, control decisions, etc.).

A DNN can be a type of convolutional neural network (CNN) that is a class of deep, feed-forward artificial neural networks (e.g., deep ANNs). A CNN may be of a type that is suitable for analyzing visual imagery. As an example, for one or more field operations, various states can exist where one or more states may be represented as an image or images. Such an image or images can be structured for analysis rather than visual inspection by the human eye. For example, a CNN may be applied to recognizing images of animals as in pixel-based photographs where a human can confirm via visual inspection that an input image of a cow has been properly classified by the CNN to be an image of a cow; whereas, for field operations (e.g., planning, execution, etc.), a pixel-based image may have little recognizable information to a human via visual inspection, yet a CNN can be utilized, for example, to classify the pixel-based image as corresponding to one or more states of one or more field operations (e.g., equipment, flows, rock conditions, etc.). Such a pixel-based image may be representative of a single point in time or may be representative of multiple points in time. In either instance, a CNN approach may be implemented for one or more purposes.

Terminology as to CNNs tends to involve visual or perception descriptors where, herein, such descriptors can be applied to analysis of what may be considered "non-image" data that are organized in an image format (e.g., in a pixel-based format, etc.).

CNNs can use a variation of multilayer perceptrons designed for minimal preprocessing. CNNs may be shift invariant or space invariant artificial neural networks (SI-ANN), based on their shared-weights architecture and translation invariance characteristics.

Convolutional neural networks, as neural networks generally, find a basis within biological processes in which a connectivity pattern between neurons is inspired by organization of an animal's visual cortex. For example, individual cortical neurons tend to respond to stimuli in a restricted region of a visual field known as the receptive field where receptive fields of different neurons partially overlap such that they cover the entire visual field within an animal's view.

CNNs tend to use relatively little pre-processing compared to some other types of image classification algorithms. As such, a network learns filters that in other approaches may have been hand-engineered. Independence from prior knowledge and human effort in feature design can be beneficial.

As an example, a method can include one or more deep neural networks (DNNs) that can be trained, for example, to provide time series data. Such a method can utilize a simulator where the one or more DNNs are components of the simulator. As an example, such a method can improve control of field operations, for example, by interactions with a controller (e.g., for testing, calibration, real time decision making, etc.).

Figure 7:
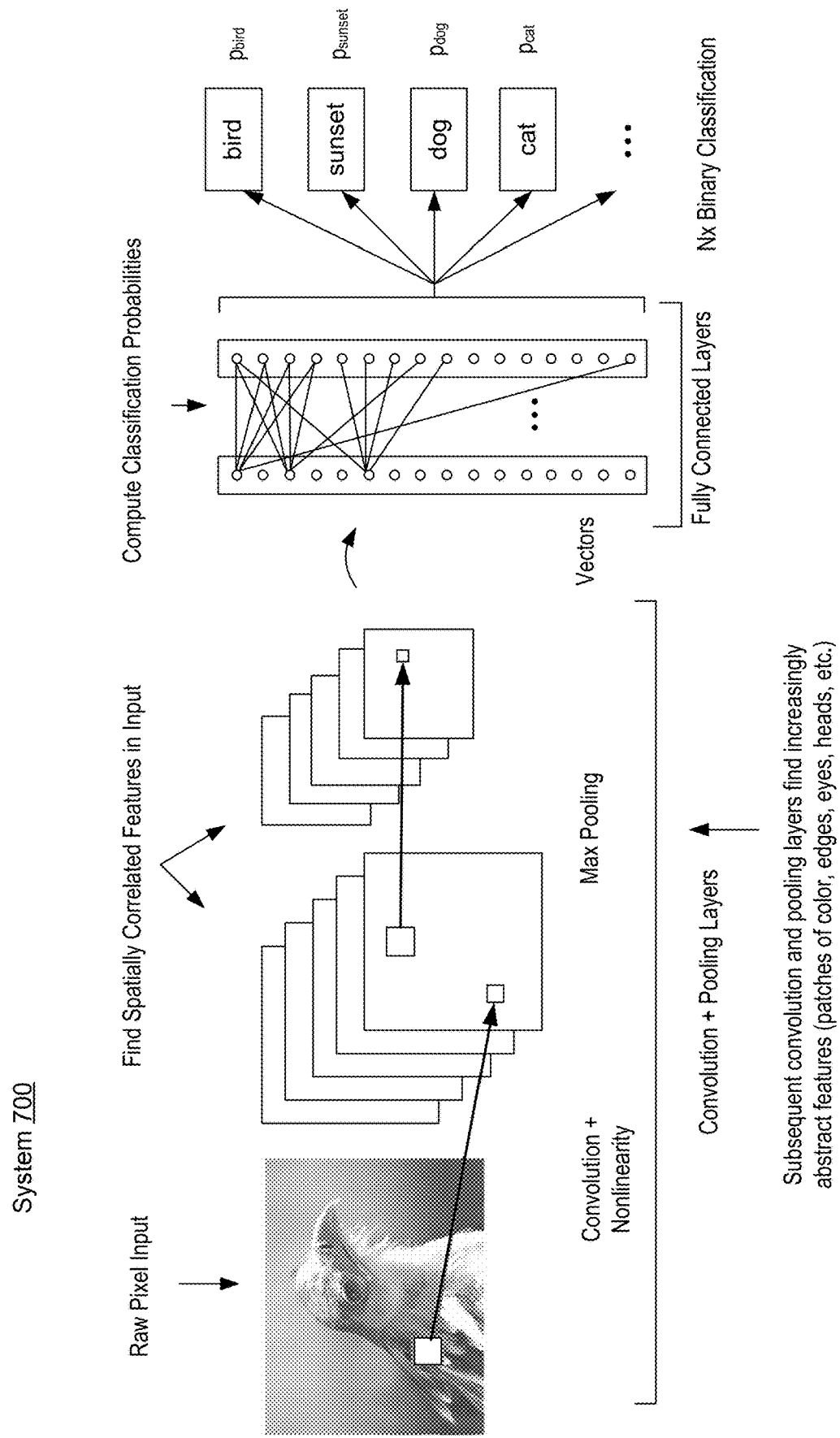
FIG. 7 illustrates an example of a system.

FIG. 7 shows an example of a system 700 that includes a deep neural network (DNN) applied to computer vision. As shown, the system 700 can receive information via an input layer, analyze information via hidden layers and output information via an output layer. The information received at the input layer can be images such as facial images that are composed of pixels, which may be in a color space (e.g., RGB, grayscale, etc.).

The system 700 may learn (e.g., be trained) in one or more manners. Learning may be deep learning. As an example, learning can include unsupervised learning, reinforcement learning, supervised learning, semi-supervised learning, etc.

Deep learning can be applied to tasks where a basic unit, a single pixel, a single frequency, or a single word/character may have a relatively small amount of meaning in and of itself but where a combination of units has a relatively larger amount of meaning. As an example, a combination of units may be assessed as to individual values of the units, which may be collectively useful. As an example, a method can include deep learning of useful combinations of values without human intervention. For example, consider deep learning's ability to learn features from data of a dataset of handwritten digits. In such an example, when presented with tens of thousands of handwritten digits, a deep neural network can learn that it is useful to look for loops and lines when trying to classify the digits.

Deep learning can be implemented using one or more techniques or technologies, such as, for example, an optimizer, stochastic gradient descent, unsupervised data pre-training of models to automate feature extraction, transfer functions, large data set(s) size, multiple processors (e.g., GPUs and/or CPUs) to accommodate considerable computational costs incurred by deep neural network models combined with large datasets, etc.

As an example, each successive layer in a neural network can utilize features from a previous layer to learn more complex features. Consider an example, with reference to the system 700 of FIG. 7, an approach where, at the lowest level, the neural network fixates on patterns of local contrast. A next layer can then use those patterns of local contrast to fixate on data that resemble eyes, noses, and mouths as facial features. Another subsequent layer can (e.g., a top layer) can then apply those facial features to face templates. In such an example, a deep neural network is capable of composing features of increasing complexity in each of its successive layers.

Thus, the system 700 can perform automated learning of data representations and features. Such an application of deep neural networks may include models that can learn useful hierarchical representations of images, audio and written language. For example, consider these learned feature hierarchies in these domains can be construed as:

Image recognition: Pixel→edge→texton→motif→part→object

Text: Character→word→word group→clause→sentence

Speech: Sample→spectral band→sound→ ... → phone→phoneme→word

Another example of DNN technology exists in AlphaGo (Silver, et. al, Mastering the Game of Go with Deep Neural Networks and Tree Search. Nature, Vol. 529, 28 Jan. 2016, p. 484-489 and appendixes and extended data, which are incorporated by reference herein) as applied to the game "Go", an abstract strategy board game for two players, in which the aim is to surround more territory than the opponent. Go has relatively simple rules yet is very complex, even more so than chess, and possesses a large number of possibilities. Compared to chess, Go has both a larger board with more scope for play and longer games, and, on average, many more alternatives to consider per move. In Go, the playing pieces are called stones. One player uses the white stones and the other, black. The players take turns placing the stones on the vacant intersections (named "points") of a board with a 19×19 grid of lines.

In AlphaGo, DNN technology is trained to learn heuristics that guide search more efficiently in a massive search space. AlphaGo utilizes two kinds of DNNs: a value network to evaluate board positions and a policy network used to evaluate moves, and they are trained by a mix of supervised learning through studying examples provided by human and self-playing in the style of reinforcement learning. These pre-trained DNNs allow the heuristic search algorithm (through Monte Carlo sampling) to identify promising moves without looking ahead thousands of steps and can effectively beat world-class human players despite a search space that includes a relatively astronomical number of states.

The system 700 can be for machine classification and learning. As shown, the system 700 includes convolution and pooling layers, fully connected layers and Nx binary classifications as outputs. In the example of FIG. 7, input is a raw pixel image where convolution and nonlinearity techniques are implemented for finding spatially correlated features in the input image, for example, via maximum pooling. Convolutional networks can include local or global pooling that combine outputs into an input or inputs (e.g., for another layer or layers). Maximum pooling (or "max pooling") may use the maximum value from each of a cluster of neurons at the prior layer while average pooling (or "ave pooling") may use the average value from each of a cluster of neurons at the prior layer.

As shown, the system 700 can compute classification probabilities for a vector via fully connected layers such that classifications can be made, which, in the example of FIG. 7, pertain to image content (e.g., bird, sunset, dog, cat, etc.). As indicated, subsequent convolution and pooling layers can find increasingly abstract features (e.g., patches of color, edges, eyes, heads, etc.) within image data. Some examples of features associated with hidden layers can include, for example, various types of curved or circular features (e.g., animal features, non-animal features, etc.).

FIG. 8 shows examples of three neural network systems 810, 820 and 830. The system 810 is a feed-forward neural network; the system 820 is a layered neural network with an input layer; a fully recurrent hidden layer and an output layer; and the system 830 is a fully connected recurrent neural network.

A recurrent neural network (RNN) can include various units interacting in discrete time via directed, weighted connections with weights where each unit includes an activation y(t) updated at each time t=1, 2, .... The activations of the units feed into other units and form the state of the RNN. Input and output to a RNN can be time-varying series of vector-patterns called sequences. Learning in an RNN can be defined as optimizing a differentiable objective function E, summed over time steps of sequences by adapting the connection weights. For a dataset including sequences of patterns, E is the sum of E(t) over patterns of sequences in the dataset.

As an example, a gradient descent learning technique for a RNN can include one or more "long short-term memory" (LSTM) units (e.g., as a recurrent unit or units). Such an approach can compute the gradient of E with respect to each weight (e.g., $w_{lm}$ from unit m to unit l) to determine weight changes $dw_{lm}$:

$$dw_{lm}(t) = -\alpha \frac{\partial E(t)}{\partial w_{lm}}$$

where α is the learning rate.

As shown in FIG. 8, RNN topologies can include partly recurrent and fully recurrent networks. An example of a partly recurrent network is a layered network with distinct input and output layers, where the recurrence is limited to the hidden layer(s) as shown in the system 820 of FIG. 8; whereas, in the system 830 of FIG. 8, a fully recurrent network, each node gets input from the other nodes.

Various issues can arise in gradient information. For example, there can be exponential decay of gradient information. Consider a scenario where temporal evolution of the path integral over error signals flows back in time exponentially in a manner that depends on the magnitude of the weights. This implies that the back-propagated error quickly either vanishes or blows up. Hence a "standard" RNN may fail to learn in the presence of long time lags between relevant input and target events. For example, tasks with time lags greater than 5 to 10 increments can become difficult for such an RNN to learn within reasonable time. A so-called vanishing error problem can confound operation of a RNN.

The LSTM technique (e.g., operational component and data structure) can overcome decay issues by enforcing non-decaying error flow back into time. Such an approach can learn to bridge minimal time lags, for example, in excess of 1000 discrete time steps by enforcing constant error flow through constant error carrousels (CECs) within special units, called cells. Multiplicative gate units can learn to open and close access to the cells. Thus, LSTM rather quickly solves many tasks traditional RNNs cannot solve. A LSTM learning technique tends to be local in space and time; and its computational complexity per time step and weight for standard topologies can be approximately O(1).

Figure 9:
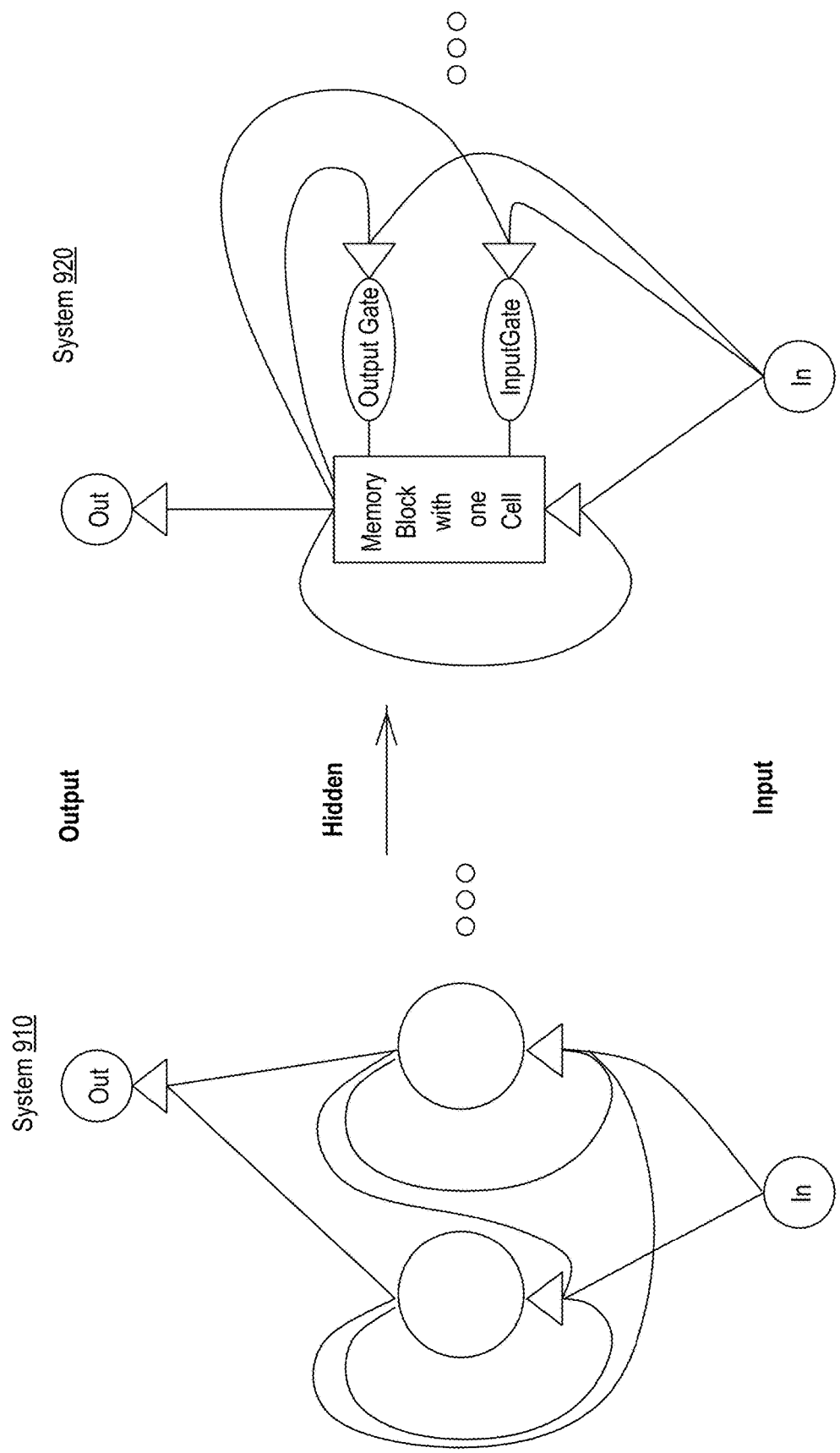
FIG. 9 illustrates examples of systems.

FIG. 9 shows an example of a system 910 and a system 920, which includes a RNN with one fully recurrent hidden layer. As shown, the system 920 includes a LSTM network with memory blocks in the hidden layer; while a single instance is illustrated a RNN can include multiple instances of LSTMs as examples of recurrent units.

The basic unit in the hidden layer of an LSTM network is the memory block; it replaces the hidden units in a "traditional" RNN as shown in the system 910 of FIG. 9; see replacement in the system 920 of FIG. 9. A memory block can include one or more memory cells (e.g., with associated memory device(s)) and a pair of adaptive, multiplicative gating units which gate input and output to cells in the block. Memory blocks allow cells to share the same gates (provided the task permits this), thus reducing the number of adaptive parameters. Each memory cell includes at its core a recurrently self-connected linear unit called the "Constant Error Carousel" (CEC), whose activation can be called the cell state. A CEC can solve the vanishing error problem: in the absence of new input or error signals to the cell, the CEC's local error back flow remains constant, neither growing nor decaying. The CEC is protected from both forward flowing activation and backward flowing error by the input and output gates, respectively. When gates are closed (activation around zero), irrelevant inputs and noise do not enter the cell, and the cell state does not perturb the remainder of the network.

FIG. 10 shows an example of a portion of a system 1000 with a memory block with a single cell. Such an LSTM cell has a linear unit with a recurrent self-connection with weight 1.0 (CEC). Input and output gate regulate read and write access to the cell whose state is denoted sc. The function g squashes the cell's input; whereas, h squashes the cell's output.

FIG. 11 shows an example of a portion of a system 1100 that includes an example of a memory block with one cell for an extended LSTM as a type of recurrent unit (e.g., a recurrent unit with memory and an ability to forget). In the example of FIG. 11, a multiplicative forget gate can reset the cell's inner state sc.

In comparison, the system 1000 of FIG. 10 can exhibit issues that can be addressed by the system 1100 of FIG. 11 via a forget gate as in an extended LSTM or forget gate LSTM (e.g., fgLSTM), which is a type of recurrent unit. As to the system 1000, consider a scenario that presents a continuous input stream where cell states may grow in unbounded fashion, causing saturation of the output squashing function, h. This can happen even if the nature of the problem suggests that the cell states are to be reset occasionally, e.g., at the beginnings of new input sequences (whose starts, however, are not explicitly indicated by a teacher). Saturation will: (a) make h's derivative vanish, thus blocking incoming errors; and (b) make the cell output equal the output gate activation, that is, the entire memory cell will degenerate into an ordinary back-propagation through time (BPTT) unit, so that the cell will cease functioning as a memory. Such issues may not appear where cell states are explicitly reset to zero before the start of each new sequence.

As shown in the system 1100 of FIG. 11, a solution to the aforementioned problem utilizes a "forget gate", which learns to reset memory blocks, for example, once contents are out of date and hence of less value or no value. Resets can include, for example, immediate resets to zero and/or gradual resets, for example, corresponding to slowly fading cell states. As an example, a RNN can include one or more fgLSTMs that replace a traditional LSTM's constant CEC weight 1.0 by the multiplicative forget gate activation $y^\varphi$.

As an example, a DNN can include one or more components that provide a forget gate and an output activation function. For example, a recurrent unit (e.g., a fgLSTM, etc.) can provide such features. As an example, a DNN may be tuned via number of components and/or layering. As an example, a DNN can include components to learn temporal patterns in a time series or time series. As an example, a method can include hidden state initialization in a recurrent layer (e.g., an LSTM layer, etc.), for example, for a new sequence of data.

As an example, a DNN can be tuned via one or more parameters, components, etc. For example, consider the information provided in Table 1 (see para. 00187) as corresponding to a tuned DNN for purposes of yielding predictions for drilling time series. As indicated, layering/types of layers and amount of encoding/compression can be part of tuning a DNN to capture the temporal behavior. As an example, a latent space can be tuned via structure of a DNN where, for example, a lower dimension in the latent space could be too small to hold the complex information of a dynamic system while a larger dimension may create too much redundancy and incur over-fitting. As an example, a DNN can be constructed with a latent space dimension (e.g., of a recurrent unit such as a LSTM unit, which can be a fgLSTM unit, etc.) to be in a range from approximately 5 to approximately 60 or, for example, in a range from approximately 10 to approximately 50. As explained, for one or more purposes, latent space output can be processed, which can include processing that reduces dimensionality while being able to classify states of a dynamic system, optionally with temporal rendering as in, for example, an animation of transitions in states with respect to time. For example, consider a drilling operation being performed in a dynamic system where latent space output is processed to render graphics to a display that allow a person to visual one or more states and optionally state transitions of the dynamic system. Such processing may, for example, utilize a PCA and/or one or more other techniques (e.g., color coding, animation, etc.) to allow a user to comprehend state(s) of the dynamic system, optionally during performance of one or more drilling operations.

As an example, a DNN (e.g., as part of a computational framework or a computational system) can operate as a "recorder" that processes multi-channel data of a dynamic system and that outputs states of the dynamic system, for example, in a latent space. In such an example, the states can be stored to memory (e.g., in a database, etc.) and can be accessed to assess operations and responses of the dynamic system upon which those operations were performed. Such a DNN can be part of a data-driven approach to consolidating and characterizing behavior of a dynamic system for one or more purposes (e.g., archiving, control, equipment design, etc.). As an example, a system can be an archival system that processes multi-channel data of a dynamic system and archives states, optionally in association with such multi-channel data. As an example, a system may archive states without archiving multi-channel data such that an amount of data stored is reduced. As an example, archived states may be "played back" in an animation where one or more graphical controls can allow for moving forward or backward in time and/or allow for filtering (e.g., in time, in state space, as to behavior, etc.). As an example, archived state space data may be processed using a DNN, for example, by feeding such state space data into one or more fully connected (FC) components (FCs) where, for example, each FC component can correspond to a particular channel.

Figure 12:
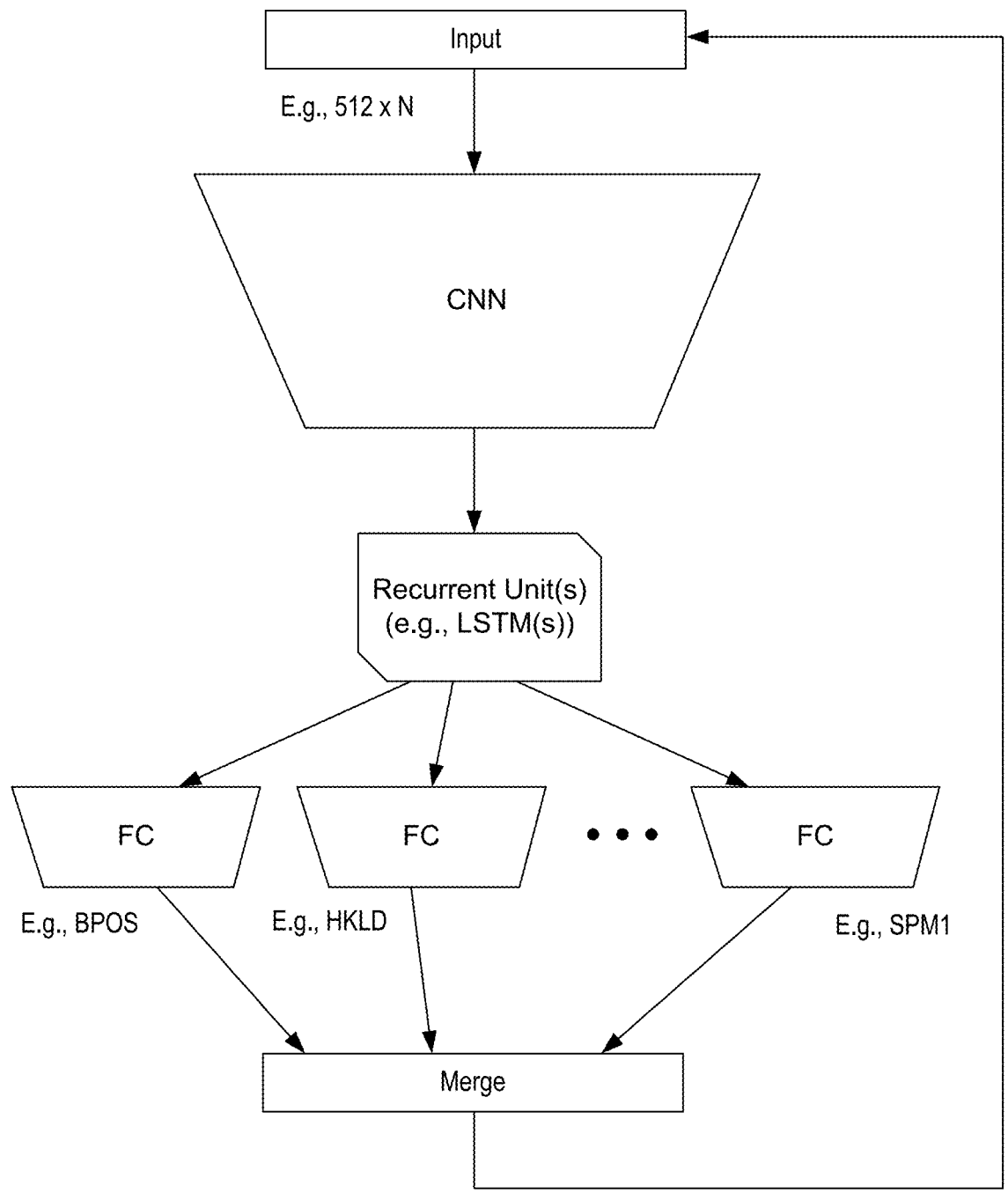
FIG. 12 illustrates an example of a system.

FIG. 12 shows an example of a system 1200 that includes an input component, a CNN component, one or more recurrent units (e.g., LSTM components, etc.), FCs and a merge component. In the example of FIG. 12, the system 1200 can include a FC component for each of a plurality of corresponding channels such as, a BPOS channel, a HKLD channel, a pump rate channel (e.g., stroke per minute "SPM" channel such as "SPM1"), etc.

As an example, a drilling automation system can make continuous decisions by integration and analysis of surface and/or downhole measurements in real time to improve drilling performance (e.g., to make drilling more efficient, etc.). Such measurements can include measurements as to downhole mechanics, formation attributes, and surface mechanics that are captured as multi-channel time series data. For example, a block position channel (BPOS) can measure the height of a travelling block, and a hookload channel (HKLD) can measure the load of the hook. These channels can reflect the surface mechanical properties of the rig in real time.

A drilling time-series simulator can enrich a dataset for one or more purposes (e.g., testing, calibration, control, etc.). For example, such a simulator can enable inference of drilling states in real time. Simulations based on a physical model can be limited in certain aspects and may not generate realistic features such as complex physical patterns, noise, and gaps.

As an example, a data-driven approach using a deep neural network (DNN) can be utilized in a simulator. Deep can refer to the neural network model with many latent layers which are utilized to accomplish various tasks. A DNN can include various types of neurons or layers based on their functionalities in design, such as the basic fully-connected type layer for regression and classification, convolutional layer for feature extraction and integration, and long short-term memory, a type of recurrent layer for temporal pattern learning. In the system 1200 of FIG. 12, such types of neuron layers can be employed.

As an example, a DNN can learn from real data, characterize different drilling responses, condition the data, and generate realistic drilling time series.

As shown in FIG. 12, the system 1200 can be a DNN with multiple convolutional, recurrent, and fully connected layers. The system 1200 can be characterized by its architecture. Besides the input and output layers (e.g., or components), the DNN includes convolutional (CNN), at least one recurrent unit (e.g., at least one LSTM, which may be a fgLSTM, etc.), and FCs (fully connected (FC) components). In the input layer, as an example, a time window can include 512 samples from each channel, which can be fed into the DNN. As an example, the time window size can be adjusted based on the input sample rate and/or one or more other bases. In the system 1200, the CNN can extract the characteristics from the input signal, while the recurrent unit(s) learns temporal patterns. As mentioned, the recurrent unit(s) can include one or more LSTMs (e.g., fgLSTMs or other memory units with forgetting, etc.). In the example of FIG. 12, the DNN can utilize each FC component for synthesizing information and predicting the value of the very next data point for each channel. In such a manner, temporal information is predicted using learned temporal patterns, which can be learned in a manner that includes forgetting (see, e.g., the system 1100 of FIG. 11). As shown in FIG. 12, the predictions from each FC component can be merged into a vector, which can be fed back to the input layer as the input for a next round (e.g., a next iteration in time, etc.).

As an example, consider the system 1200 being configured as follows within a simulator as to its components: N is the number of channels (N=6); CNN is convolutional layers, while the recurrent layer is a long short-term memory layer (e.g., with at least one LSTM, which can include at least one fgLSTM), and FC represents fully-connected layers where each channel has its own FC component, and the output from each FC is then merged into one vector, and fed back into the input for the next round (e.g., a subsequent iteration).

TABLE 1

List of some examples of configurations and functions.

| Layer Index | Layer type | Number of Neurons/Filters |
|---|---|---|
| 1 | Input | 512 × 6 |
| 2 | Convolutional | 64 |
| 3 | Convolutional | 64 |
| 4 | Max Pooling | |
| 5 | Convolutional | 128 |
| 6 | Convolutional | 128 |
| 7 | Max Pooling | |
| 8 | Convolutional | 512 |
| 9 | Convolutional | 512 |
| 10 | Convolutional | 512 |
| 11 | Convolutional | 512 |
| 12 | Max Pooling | |
| 13 | LSTM | 512 |
| 14 | LSTM | 512 |
| 15 | LSTM (latent space) | 32 |
| 16 | Fully Connected | 1024 × 6 |
| 17 | Fully Connected | 1024 × 6 |
| 18 | Fully Connected | 512 × 6 |
| 19 | Fully Connected | 1 × 6 |
| 20 | Merge | 6 |

As to CNNs, as explained, they can be trained to capture features from input signals (see, e.g., the system 700 of FIG. 7).

FIG. 13 shows an example of filters 1300, specifically an example of 2D convolutional layer with n 3×3 filters where the weight on each filter can be learned during training process by convolving with the input.

As an example, a DNN can employ eight convolutional layers to characterize time series data. As shown in Table 1, the layers 2 to 12 in the network are the convolutional and max-pooling layers. As an example, a kernel size can be set to 3 for the layers and the number of filters can increase (e.g., from 64 to 512, etc.) as the network goes deeper. As shown, the output of the convolutional layers can be fed into recurrent layers.

As to recurrent layers, as mentioned, one or more recurrent units can be employed, which can include one or more long short-term memory (LSTM) units (e.g., LSTM, fgLSTM, etc.). As explained, one or more recurrent units can be used in recurrent neural network for temporal pattern learning. For example, where a recurrent unit is a LSTM unit or component, it can include five sub-components: input gate, forget gate, output gate, hidden state, and cell (see, e.g., FIGS. 11 and 14).

Figure 14:
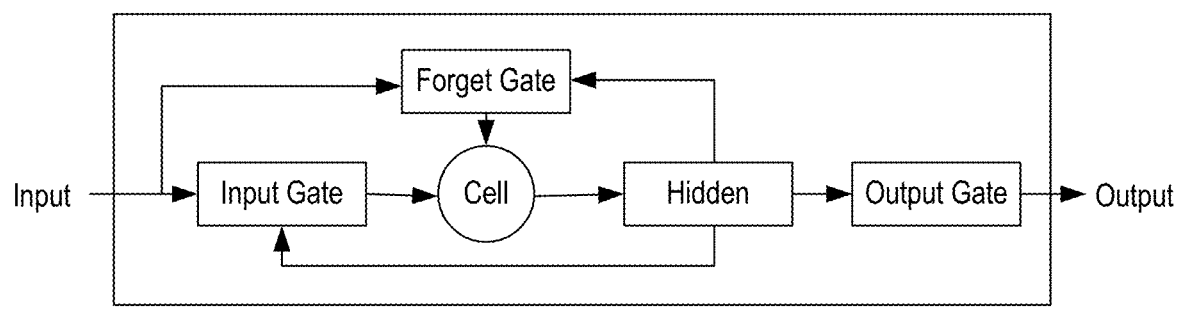
FIG. 14 illustrates an example of a recurrent unit with a forget gate.

FIG. 14 shows an example of a recurrent unit (e.g., a LSTM unit or component) 1400 that includes input gate, forget gate, output gate, hidden state and cell components (e.g., as sub-components). The input gate controls how much information goes into the cell, while the output gate controls the amount of information going out of the cell. The cell can recursively learn from the past with a feedback controlled by the forget gate. The hidden unit can control the learning of these units. As an example, a recurrent unit can include various features (e.g., sub-components) that may include one or more of the features of the recurrent unit 1400 of FIG. 14.

As an example, a DNN can employ three LSTM layers as three recurrent layers (e.g., layers 13 to 15 in Table 1) to learn temporal patterns discovered from lower convolutional layers. As an example, from layer 16 (see, e.g., FC components in FIG. 12), the DNN can be tuned to each channel output individually, such that an LSTM unit at layer 15 is the deepest layer that learns the relationship among the channels. As an example, layer 15 can be the "narrowest" layer in the DNN with, for example, 32 cells. As an example, the output of layer 15 can be a vector data structure with 32 entries. As an example, input to the DNN at layer 1 with 512×6=3072 dimensions can be compressed and encoded to 32 dimensions at layer 15 (e.g., an n-dimensional vector with n=32).

The generated information at the recurrent layers can be defined with respect to a latent space. A latent space can refer to a "hidden" space, as may be embedded within a DNN (e.g., associated with "hidden" cells, nodes, etc.). The latent space is where a compressed version of "output" can exist. For example, in the foregoing example, the compressed output is n-dimensions where n is given to be, for example, 32; whereas, the input is of m-dimensions, which is given to be, for example, 3072. One or more processes can operate on the n-dimensional output or a portion thereof as a representation of output, as compressed, in the "latent space".

As an example, one or more techniques may be utilized to operate on information generated that may be in the latent space for purposes of rendering to a display or displays (e.g., and/or one or more other output devices) and/or for purposes of control of one or more field operations.

As mentioned, the output of the recurrent layers (e.g., LSTMs, etc.) pertains to learned temporal patterns, which, for example, can be used to reconstruct one or more channel signals (e.g., with fully connected layers, etc.). For example, a DNN can include a compression process and an expansion process where the transition between such processes is the recurrent output (e.g., compressed output in a latent space).

Figure 15:
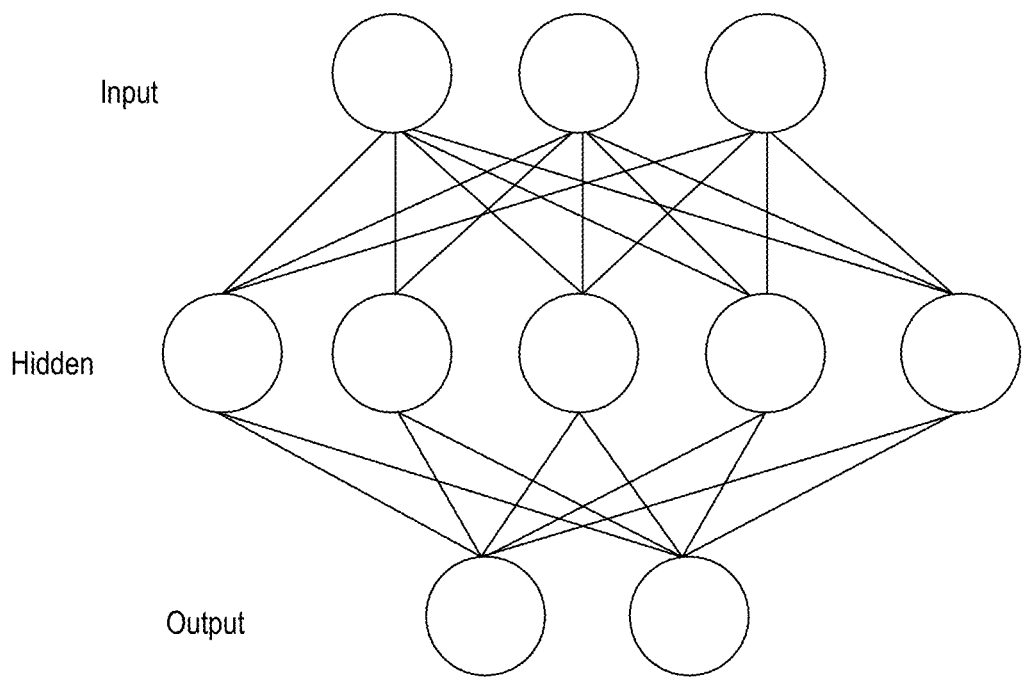
FIG. 15 illustrates an example of fully-connected layers.

FIG. 15 shows an example of three-fully connected layers 1500. The fully connected layers are a fundamental type of neural networks. Output neurons can be linear-weighted summation of their inputs, and can include a non-linear activation function (e.g., sigmoid function, arctan function, etc.). As an example, neurons can be fully connected between two intermediate layers, such as the multilayer perceptrons (MLP). Fully connected layers may be combined with convolutional layers as the last few layers in a network to integrate features that derived from lower levels and yield the final predictions.

As an example, in the DNN of the system 1200 of FIG. 12, a FC component (e.g., or components) can include four layers with 1024, 1024, 512, and neuron(s) in each layer. The output of the FC component can be a prediction of a next sample in each of one or more corresponding channels, so together, for example, for six channels, there can be six FC components in a network. As an example, each FC component can receive input from the n-dimensional vector generated from the recurrent layer (e.g., layer 15, which can include one or more fgLSTMs, etc.) and translates that input into a single value of each channel.

As to training, real drilling time series data with sample rate of 5 second/sample were fed into a DNN, as defined by various parameters of Table 1, including channels of block position (BPOS), hookload (HKLD), pressure (SPPA), surface torque (STOR), RPM, and pump rate (SPM1). In such an example, each channel included 42,287 samples in sequence. A window of 512 samples was fed into the network in each training step.

As an example, a loss function can be defined as the mean-square error between the predicted and actual values. A training process can aim to minimize the loss function. Each pass of learning with the training data used can be defined as one epoch, where 200 epochs were utilized to achieve an accuracy of approximately 98 percent. The network was trained on a computer with i7 CPU, 32G memory, with a graphic card (NVIDIA GeForce 1080Ti card, NVIDIA, Santa Clara, Calif.) for about two hours.

FIG. 16 shows example plots 1610 and 1630 that demonstrate how the loss (the plot 1610) and accuracy (the plot 1630) evolve as functions of the training steps. As an example, overfitting can be an issue in training neural networks when the model is over-bounded to the training samples. Such overfitting can incur early-stopping during simulation, for example, due to the network not generalizing enough to accommodate the small variations in the input during the simulation process, so that it fails to predict the immediate next sample point. In various trails, the training dataset is sufficiently large (e.g., more than forty-two thousand samples) such that overfitting is not a substantial concern. Specifically, loss and accuracy during training is illustrated in FIG. 16 where the plot 1610 shows loss as a function of step count in training where a dashed line is the raw accuracy, while the solid is smoothed by median filter (window size=63). The loss achieves $1.2e^{-4}$ after 200 epochs; and where the plot 1630 shows accuracy as a function of step count in training where the dashed line is the raw accuracy, while the solid is smoothed by median filter (window size=15). As mentioned, the average training accuracy achieved 98 percent after 200 epochs.

As an example, the system 1200 can generate a segment of simulated time series using a trained DNN thereof. DNN state dynamics may be determined and, for example, rendered to a display.

Figure 17:
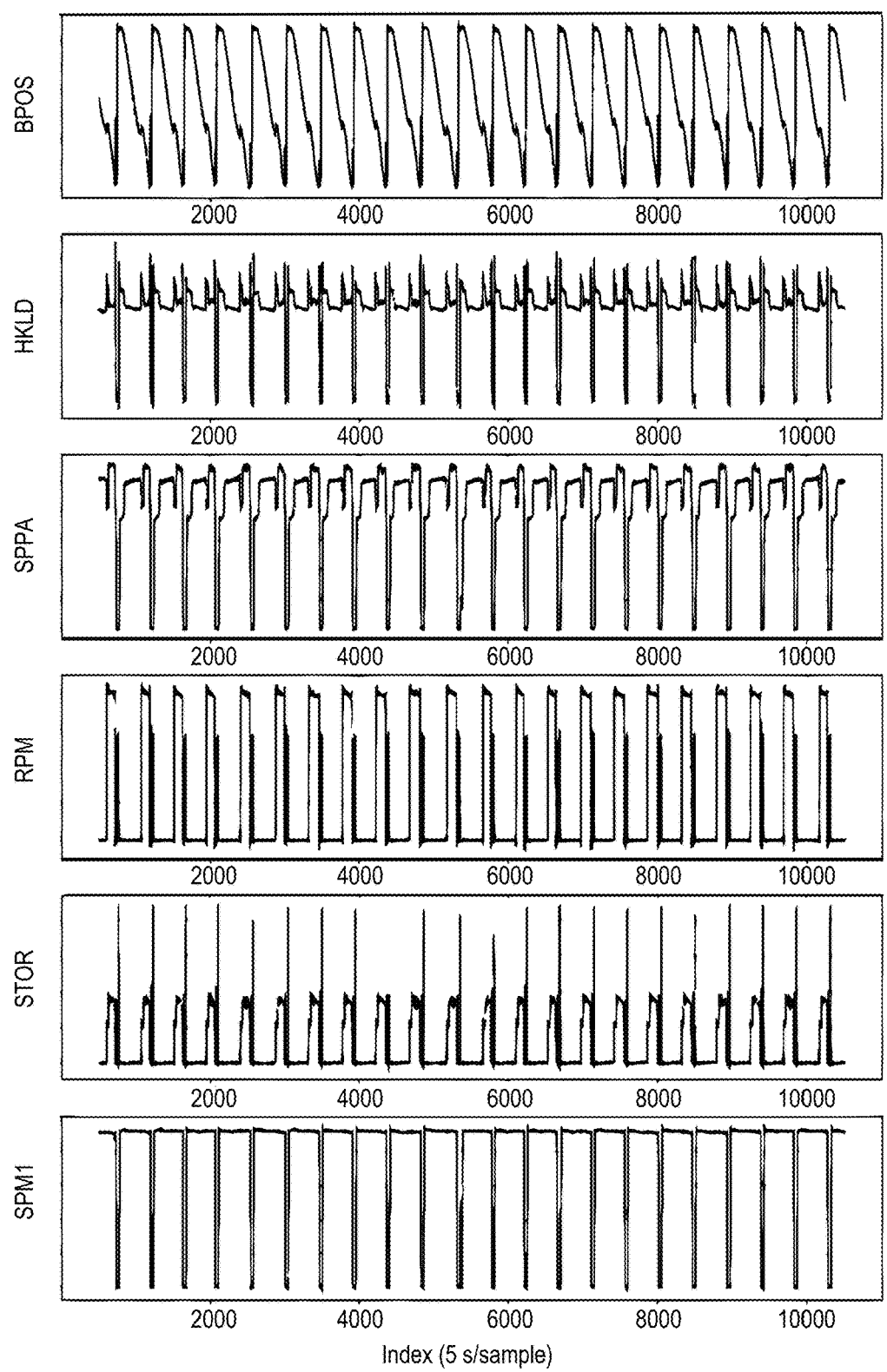
FIG. 17 illustrates examples of plots.

FIG. 17 shows a series of plots 1700 of simulated time series data, as simulated recursively. The plots 1700 represent more than ten-thousand data points of simulated 6-channel time series (e.g., BPOS, HKLD, SPPA, RPM, STOR, and SPM1).

Figure 18:
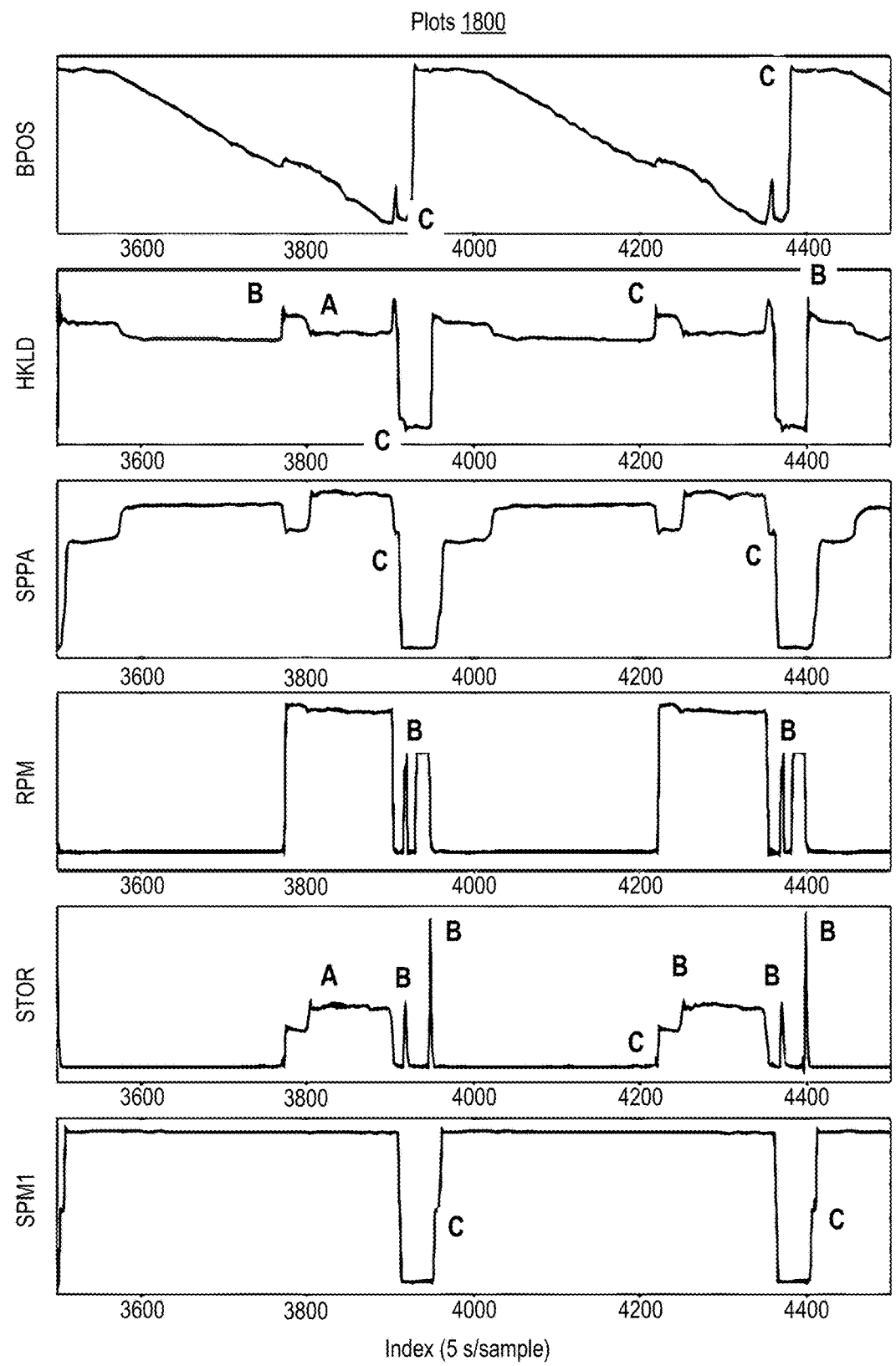
FIG. 18 illustrates an enlarged section of the plots of FIG. 17.

FIG. 18 shows a segment from the plots 1700 of FIG. 17 that further illustrates various details. As shown, the simulated time series preserved the features of the original training data, while maintaining the data distribution of multiple channels. For example, standpipe pressure (SPPA) is highly correlated with the pumping rate (SPM1). In addition, there is a consistent "in slips" pattern (e.g., at around 3900 seconds) among the simulated channels: the HKLD reached its minimum level, pump is off, and BPOS moved to top to make connection. FIG. 18 also highlights a few characteristics observed in real data: the "noise"-like dynamics (marked with "A") observed in HKLD and STOR channels; the spikes (marked with "B") in HKLD, STOR, and RPM channels; and the subtle signal variation patterns (marked with "C"). These features differ from stand to stand in the simulation, which demonstrates the realistic output that can be generated using the system 1200 of FIG. 12 (e.g., a data-driven system) when compared to a physics model-based simulator that does not include features for noise, gaps, etc. or parameters tuned on a per stand basis. Again, the plots 1700 of FIG. 17 show more than ten-thousands 6-channel samples generated with a DNN simulator where the generated time series represents drilling multiple stands with some variations in each stand.

As mentioned, a method can include latent space visualization. As explained, the latent space can be defined as the space that includes the temporal information as in the output vector (n-dimensional) generated by the last recurrent layer (see, e.g., layer 15 in Table 1).

Figure 19:
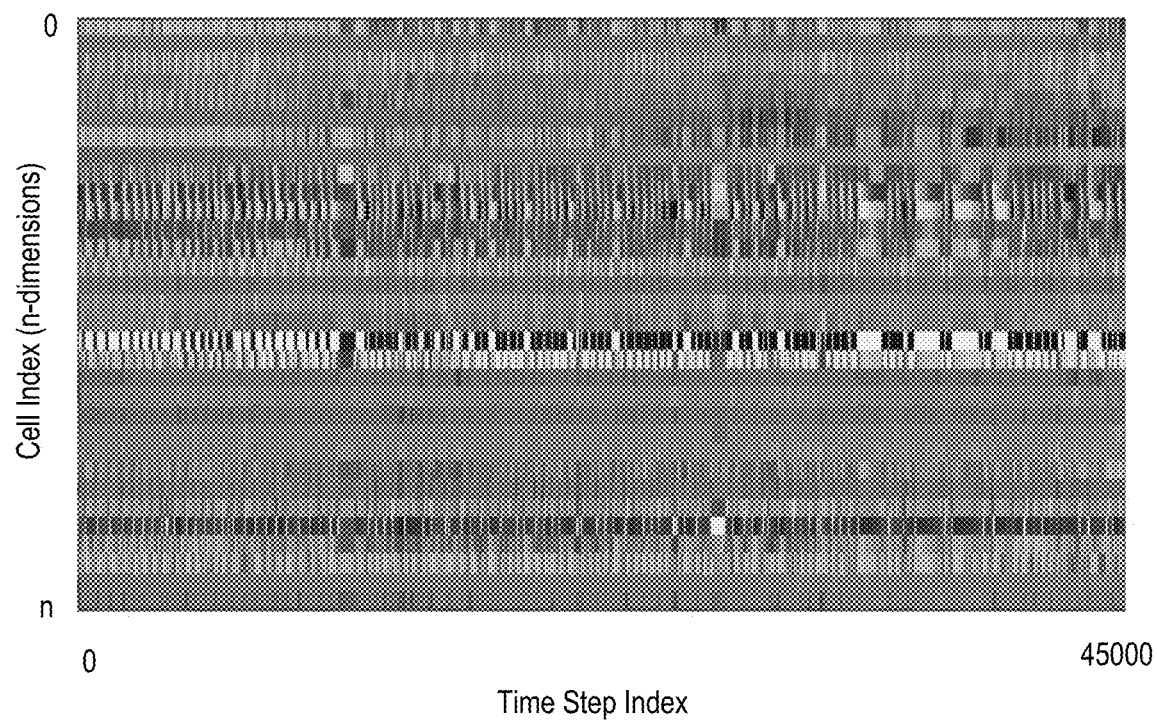
FIG. 19 illustrates generated encoded output in a latent space.
Figure 20:
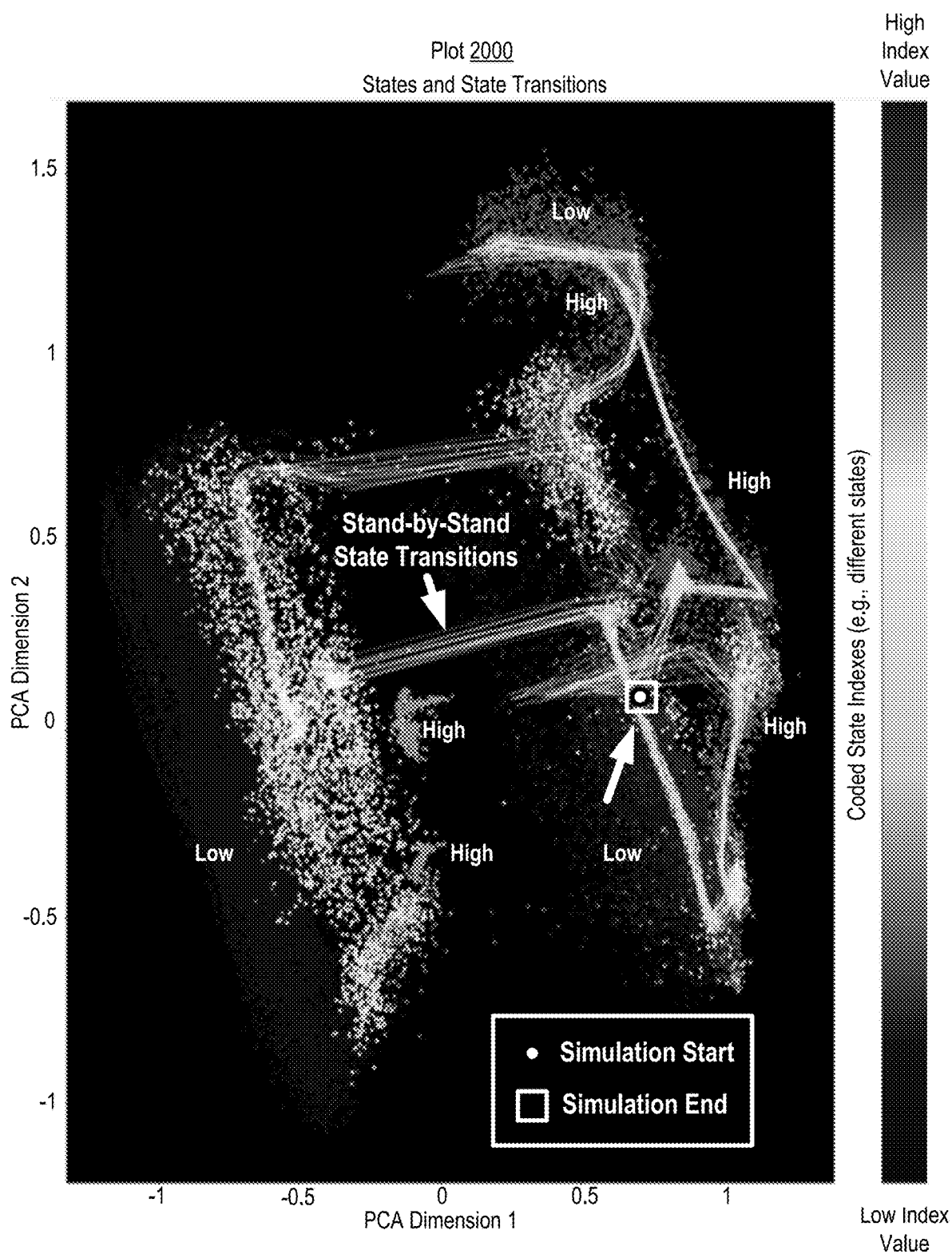
FIG. 20 illustrates a visualization based on the output of FIG. 19.

FIGS. 19 and 20 present how a network can encode time series in the latent space. FIG. 19 shows generated encoded output 1900 of training data of each time step as encoded into 32 dimensional vectors where neuronal responses are color-coded with black and white. In the system 1200 of FIG. 12, the CNN and recurrent layer components can work together as an auto-encoder. In the example of FIG. 19, the high-dimensional time series input data (512 samples by 6 channels) is compressed into 32-dimensional vector (e.g., n-dimension vector or n-dimensional vector). Specifically, FIG. 19 shows an encoded time sequence in the latent space where the training data of each time step is encoded into 32 dimensional vectors and the neuronal responses are color-coded with black and white and where the x-axis is the time step while the y-axis is the neuron index in layer 15 (e.g., n-dimensional where n=32).

FIG. 20 demonstrates the dynamics of the simulated time series in the latent space. To visualize the dynamics of drilling states, a principal component analysis (PCA) transform was applied to reduce the dimension and then the training dataset rendered as the dots in the space, and coded by a rig state processor (e.g., using a numerical index from a low index value to a high index value where each value represents a different state), which interprets the drilling time series into different rig states as shown in Table 2, such as in and out of slips, on/off bottom, etc.

TABLE 2

List of some examples of rig states.

| Index | State |
|---|---|
| 0 | Rotary Drilling |
| 1 | Slide Drilling |
| 2 | In Slips |
| 3 | Reaming |
| 4 | Tripping in, Pumping |
| 5 | Tripping in, Rotating |
| 6 | Tripping In |
| 7 | Back Reaming |
| 8 | Tripping out, Pumping |
| 9 | Tripping out, Rotating |
| 10 | Tripping Out |
| 11 | Rotating & Pumping |
| 12 | Pumping |
| 13 | Rotating |
| 14 | Stationary |
| 15 | Unknown |

The rig state labels are not used in the training process; rather, they were used to generate a visualization, which shows that the DNN model encodes the multi-channel drilling data with the respect to the drilling physical states, as the emerging clusters correlating to rig state labels.

In the example of FIG. 20, the white lines show the dynamics of the simulated states. The simulation started at the white circle in the middle-right and ends at the white box, which is at approximately the same location. The loops of the white lines correspond to multiple stands drilled. The drilling states path is repeated, but with certain variations in each stand.

Specifically, FIG. 20 shows a visualization of dynamics of simulation in latent space as output by a simulator. The data are from the last recurrent layer output, which is projected onto the first two PCA dimensions, which represents the latent space of encoding. Points are color coded by rig state as in Table 2. The white line overlain on the point projection shows the dynamics of simulation. As mentioned, the dynamic simulation started at the location as indicated by the white circle and ended at the location of white box.

As explained, the system 1200 can simulate a segment of drilling data that successfully captures complex patterns observed from a real dataset. The system 1200 of FIG. 12 is a simulator that can simulate drilling time series in a manner that include non-trivial physics and properties, including those pertaining to formation, rig, and sensors. The results show that the generated data is realistic and includes "curve" patterns.

As an example, a length of a simulation can depend on the initial states, which may be selected to be random states of the network. As an example, DNN weights may be initialized with random numbers, so that in each run the network may simulate differently. The length of simulation can depend on the amount of error accumulated during a simulation. As shown in FIG. 20, each loop in the feature space (latent space) corresponds to activity of drilling one stand. As mentioned, there are variations and uncertainties within loops, which may possibly lead the simulation to halt at a steady state. As an example, one or more approaches can be utilized that can employ initial information that may not be random and/or that may include less random content. For example, an initial state can be characterized using output of a physical model where weights may be initialized and/or "brought online" in a particular manner. As an example, a method can include ramping up a system using a first number of channels, which may be increased with respect to time. As mentioned, for recurrent layer(s), one or more fgLSTMs may be utilized, which may be set-up and/or turned on in a particular manner for purposes of handling different dynamics.

As an example, a simulation may be performed in an autonomous manner and/or in a manner that involves control of the simulation. For example, consider control of one or more fgLSTMs, which, for example, may be reset responsive to occurrence of one or more conditions (e.g., one or more states). In such an example, consider a state where a change in equipment may occur, where tripping-out and tripping-in may occur, a change in drilling crew, etc. Such states can correspond to states in at least a portion of training data; noting that training may not sufficiently account for transitions between states with respect to various aspects of one or more fgLSTMs. In an autonomous mode of operation of a simulator, after DNN training, the simulator may run in simulation mode without input as control(s).

As an example, depth may or may not be used in training or simulation. Where depth is used, simulated channels may be correlated to depth.

As explained, a system that includes a DNN can simulate drilling time series data with complex spatio-temporal patterns. Such a system can be a simulator that models non-trivial physical rules and properties, including those associated with formation, rig, and sensors. Such a simulator can generate data with realistic "curve" patterns.

FIG. 21 shows an example of a method 2100 that includes a reception block 2110 for receiving multi-channel time series data of drilling operations; a train block 2120 for training a deep neural network (DNN) using the multi-channel time series data to generate a trained deep neural network as part of a computational simulator where the deep neural network includes at least one recurrent unit (e.g., a forget gate long short-term memory (fgLSTM) unit, etc.); a simulation block 2130 for simulating a drilling operation using the computational simulator to generate a simulation result; and a render and/or a control block 2140 for rendering the simulation result to a display and/or for controlling an actual drilling operation using the simulation results.

As an example, a computational simulator can be a specialized computational device or system that includes circuitry specialized to simulate a dynamic system. Such a computational simulator can be built using actual time series data, for example, in a data-driven manner. The computational simulator can include particular components that can be present as circuitry that can capture subtleties in actual time series data and can reproduce such subtleties in simulation results based on input. A computational simulator can include one or more processors (e.g., cores) and memory that store instructions executable by at least one of the one or more processors. Such memory can include values that are based on actual time series data such that the computational simulator includes a trained neural network as a group of components arranged according to a neural network architecture.

FIG. 21 also shows various computer-readable media (CRM) blocks 2111, 2121, 2131 and 2141 as associated with the blocks 2110, 2120, 2130 and 2140. Such blocks can include instructions that are executable by one or more processors, which can be one or more processors of a computational framework, a system, a computer, etc. A computer-readable medium can be a computer-readable storage medium that is not a signal, not a carrier wave and that is non-transitory. For example, a computer-readable medium can be a physical memory component that can store information in a digital format.

In the example of FIG. 21, a system 2190 includes one or more information storage devices 2191, one or more computers 2192, one or more networks 2195 and instructions 2196. As to the one or more computers 2192, each computer may include one or more processors (e.g., or processing cores) 2193 and memory 2194 for storing the instructions 2196, for example, executable by at least one of the one or more processors. As an example, a computer may include one or more network interfaces (e.g., wired or wireless), one or more graphics cards, a display interface (e.g., wired or wireless), etc. As an example, the instructions 2196 can include instructions of one or more of the blocks 2111, 2121, 2131 and 2141. As an example, the system 2190 can be a computational simulator that includes a trained DNN as trained using actual time series data. Such a computational simulator can be run to generate output that simulates a dynamic system where such output can be in a latent space (e.g., as to states of a dynamic system) or other space (e.g., as to one or more channels, etc.). Such a computational simulator can be a dynamic computational simulator that can simulate behavior of a dynamic system with respect to time. As an example, a computational simulator can be data-driven and trainable using different sets of actual time series data of a dynamic system. Such a data-driven simulator can be without a physics-based model of the dynamic system. For example, structural features of the simulator can be selected, arranged and tuned to simulate behavior of a dynamic system without utilizing a physics-based model or models of the dynamic system. Such an approach may result in output that exhibits subtleties that appear in actual operations and associated sensor data (e.g., without having to explicitly model such subtleties using noise assumptions, noise models, etc.).

As an example, a computational simulator can include a trained DNN model (e.g., data-driven) that encodes multi-channel drilling time series data with the respect to the drilling system physical states. In such an example, the states can be represented via output as in a latent space, which may be processed, for example, using PCA, etc., to provide for identification of clusters (e.g., emerging clusters, etc.) that can be correlated to predefined dynamic system states (e.g., rig states, etc.).

As an example, a DNN can be utilized for testing a controller. For example, a controller may be operatively coupled to equipment (e.g., field, lab, etc.) that operates with respect to an environment where the controller issues signals (e.g., commands, etc.) to control the equipment where such control may be closed-loop or open-loop. One or more sensors can provide data, which may be multi-channel data, which can be utilized as input to a DNN, which can be a trained DNN. Such a DNN can output internal state information (e.g., as to the equipment and/or the environment) that can be utilized to determine whether the controller is operating in a desired manner. Depending on the output, the controller may be tuned or calibrated, which may be performed iteratively until a desired behavior (e.g., controllable behavior, etc.) is achieved. In such an example, the testing process, which may be a tuning or calibration process, may be performed as a preliminary process prior to further operations. For example, such a process may be performed when equipment is set-up at a rigsite and prior to performing drilling operations as defined by a well plan that aim to deepen a borehole. In such an example, a preliminary process may calibrate a controller (or controllers) to generate a calibrated controller (or controllers) that can provide improved control over one or more drilling operations.

As an example, a method can include receiving multi-channel time series data of drilling operations; training a deep neural network (DNN) using the multi-channel time series data to generate a trained deep neural network as part of a computational simulator where the deep neural network includes at least one recurrent unit; simulating a drilling operation using the computational simulator to generate a simulation result; and rendering the simulation result to a display. In such an example, the method can include controlling an actual drilling operation using the simulation results. For example, the simulation results can be improved over what a physics model-based computational simulator can generate. As mentioned, a computational simulator that is data-driven can replicate dynamic system behavior(s) that are not replicated by a physics model-based computational simulator (see, e.g., stand to stand variations such as in FIGS. 17, 18 and 20). With improved simulation results, a controller can improve control, for example, by taking into account variation(s) that can occur from stand to stand, etc. As an example, a controller may utilize a stand to stand variation measure as a limit or limits, which may be utilized to determine whether control is to be stricter to reduce such variation(s).

As an example, a method can include correlating a simulation result to a physical state associated with a drilling operation. In such an example, the physical state can be selected from a plurality of pre-defined physical states. For example, consider pre-defined physical states for drilling, a rig, etc. (see, e.g., Table 2). As an example, a method can include rendering a simulation result to a display by rendering a graphic of a physical state associated with a drilling operation to the display within a dimensional space. In such an example, the dimensional space can be of fewer dimensions than a latent space associated with one of the at least one recurrent units. For example, consider use of a PCA technique that reduces dimensionality to correspond to a dimension or dimensions of one or more principal components. In such an example, a time dimension may be rendered or may be inferred by rendering of points with respect to time.

As an example, a DNN can include at least one recurrent unit that includes memory and an ability to manage the memory such as diminishing its value, resetting, etc. As an example, a recurrent unit can be defined by one or more components (e.g., sub-components). As an example, a recurrent unit can be a type of a long short-term memory (LSTM)

unit, which may be, for example, a forget gate long short-term memory (fgLSTM) unit. For example, a DNN can include at least one recurrent unit that is a fgLSTM unit.

As an example, a method can include rendering a simulation result to a display by processing output of one of at least one recurrent unit. For example, a last recurrent unit may output a vector of values that can be defined with respect to a latent space (e.g., a feature space). Such a vector of values can be processed using one or more techniques, which can include state identification (e.g., using a table of states that may be expected to be present and, for example, within a particular order). As an example, a method can include processing that reduces dimensionality of a latent space of one of at least one recurrent unit of a DNN to generate a reduced space and such a method can include rendering a graphic based on the simulation result to the display with respect to the reduced space. As an example, processing can include applying a principal component analysis (PCA) process.

As an example, a method can include processing a plurality of simulation results to generate a plurality of graphics and rendering an animation of the graphics to the display with respect to the reduced space. For example, consider a plot as in FIG. 20 where points are rendered with respect to time where a text box or other graphic may indicate a state associated with each point (see, e.g., Table 2). In such an example, a control graphic may be rendered that allows for adjusting playing of the animation (e.g., forward, backward, speed, etc.). As mentioned, a method may be a real time method where results are rendered upon generation (e.g., output and processing).

As an example, a method can include rendering a graphic based on the simulation result to the display within a series of graphics that form an animation of physical states associated with a plurality of drilling operations.

As an example, a method can include receiving multi-channel time series data of drilling operations that are for drilling operations performed with respect to an environment using equipment where the environment and equipment form a dynamic system. For example, consider rig equipment (e.g., including a drillstring with a bottom hole assembly (BHA)) being at a rigsite for drilling a borehole in a formation of a geologic environment. As an example, a computational simulator can be configured to simulate dynamic behavior of such a dynamic system.

As an example, a computational simulator can be utilized in a method for calibrating a controller, for example, by using one or more simulation results to generate a calibrated controller. In such an example, a method can include controlling at least one drilling operation using the calibrated controller. As an example, consider calibration that is based at least in part on stand to stand variations as exhibited in output from a computational simulator. In such an example, the controller may be calibrated to operate with such variations being expected during one or more drilling operations (e.g., that involve stands). Such a calibrated controller may be more finely tuned (e.g., calibrated) than a controller that relies on a physics model-based simulator.

As an example, a computational system, which may be a computational simulator, can include a data-drive structure (e.g., a DNN as in FIG. 12, etc.) and can include one or more physics model-based structures. As an example, a computational system may output both data-driven simulation results and physics model-based results. Such a computational system may be a hybrid-system where, for example, the physics model-based results may be utilized for control of a dynamic system until the dynamic system generates data sufficient to train a DNN. For example, consider training running in parallel to control where given sufficient training data, a trained DNN can begin generating output that can be utilized for control. Such an approach may include a hand-off where a transition occurs from physics model-based control to data-driven-based control. In such an example, control of a dynamic system can be improved during operations.

As an example, a system can include a processor; memory accessible by the processor; processor-executable instructions stored in the memory and executable to instruct the system to: receive multi-channel time series data of drilling operations; train a deep neural network (DNN) using the multi-channel time series data to generate a trained deep neural network where the deep neural network includes at least one recurrent unit; simulate a drilling operation using the trained deep neural network to generate a simulation result; and render the simulation result to a display. In such an example, the system can include instructions to instruct the system to control at least one piece of equipment to perform at least part of a drilling operation (e.g., based on the simulation result, etc.).

As an example, one or more computer-readable storage media can include processor-executable instructions to instruct a computing system to: receive multi-channel time series data of drilling operations; train a deep neural network (DNN) using the multi-channel time series data to generate a trained deep neural network where the deep neural network includes at least one recurrent unit; simulate a drilling operation using the trained deep neural network to generate a simulation result; and render the simulation result to a display. In such an example, instructions can include instructions to instruct the computing system to control at least one piece of equipment to perform at least part of a drilling operation (e.g., based on the simulation result, etc.).

As an example, a method may be implemented in part using computer-readable media (CRM), for example, as a module, a block, etc. that include information such as instructions suitable for execution by one or more processors (or processor cores) to instruct a computing device or system to perform one or more actions. As an example, a single medium may be configured with instructions to allow for, at least in part, performance of various actions of a method. As an example, a computer-readable medium (CRM) may be a computer-readable storage medium (e.g., a non-transitory medium) that is not a carrier wave.

According to an embodiment, one or more computer-readable media may include computer-executable instructions to instruct a computing system to output information for controlling a process. For example, such instructions may provide for output to sensing process, an injection process, drilling process, an extraction process, an extrusion process, a pumping process, a heating process, etc.

Figure 22:
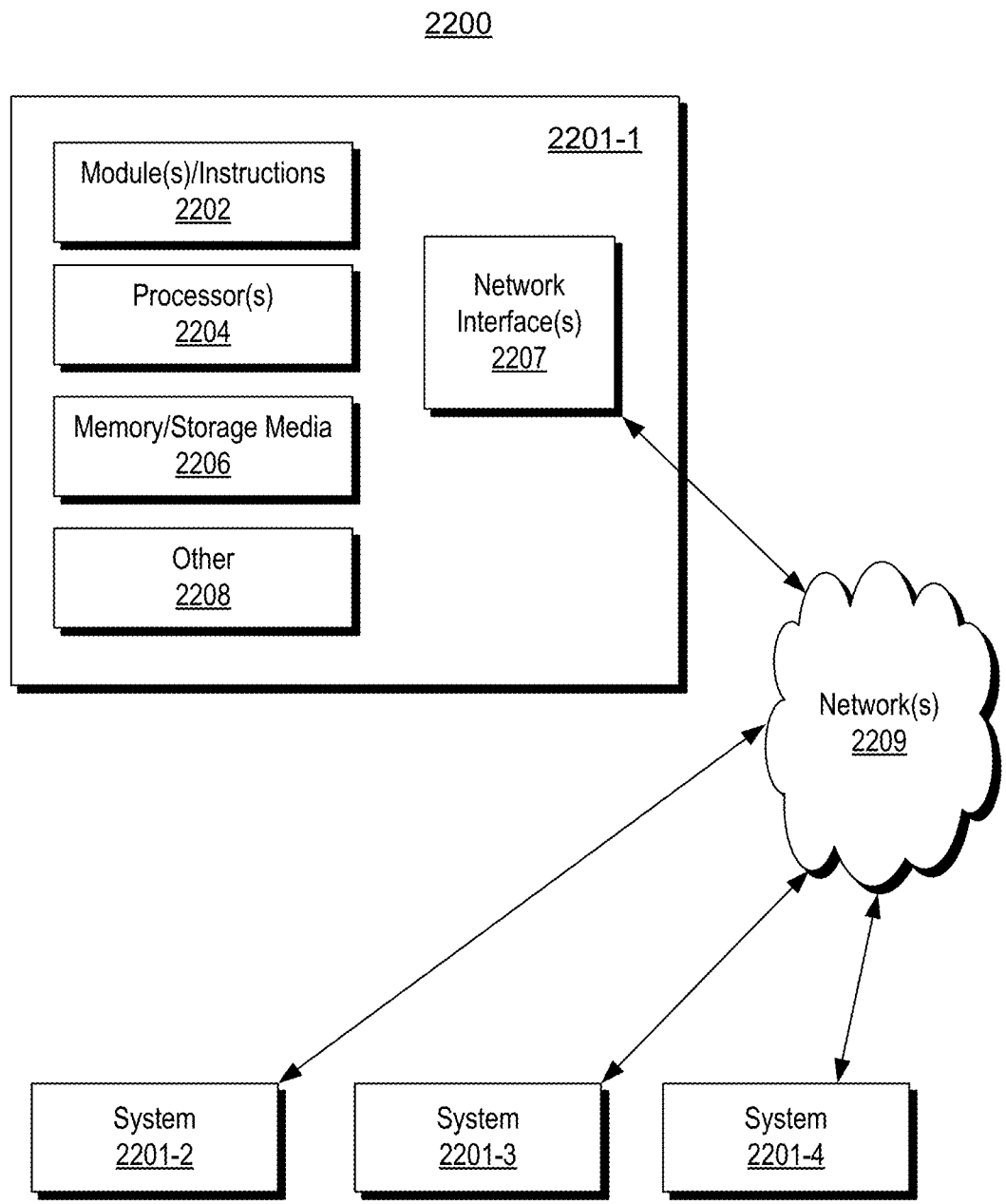
FIG. 22 illustrates an example of computing system.

In some embodiments, a method or methods may be executed by a computing system. FIG. 22 shows an example of a system 2200 that can include one or more computing systems 2201-1, 2201-2, 2201-3 and 2201-4, which may be operatively coupled via one or more networks 2209, which may include wired and/or wireless networks.

As an example, a system can include an individual computer system or an arrangement of distributed computer systems. In the example of FIG. 22, the computer system 2201-1 can include one or more modules 2202, which may be or include processor-executable instructions, for example, executable to perform various tasks (e.g., receiving information, requesting information, processing information, simulation, outputting information, etc.).

As an example, a module may be executed independently, or in coordination with, one or more processors 2204, which is (or are) operatively coupled to one or more storage media 2206 (e.g., via wire, wirelessly, etc.). As an example, one or more of the one or more processors 2204 can be operatively coupled to at least one of one or more network interface 2207. In such an example, the computer system 2201-1 can transmit and/or receive information, for example, via the one or more networks 2209 (e.g., consider one or more of the Internet, a private network, a cellular network, a satellite network, etc.).

As an example, the computer system 2201-1 may receive from and/or transmit information to one or more other devices, which may be or include, for example, one or more of the computer systems 2201-2, etc. A device may be located in a physical location that differs from that of the computer system 2201-1. As an example, a location may be, for example, a processing facility location, a data center location (e.g., server farm, etc.), a rig location, a wellsite location, a downhole location, etc.

As an example, a processor may be or include a microprocessor, microcontroller, processor module or subsystem, programmable integrated circuit, programmable gate array, or another control or computing device.

As an example, the storage media 2206 may be implemented as one or more computer-readable or machine-readable storage media. As an example, storage may be distributed within and/or across multiple internal and/or external enclosures of a computing system and/or additional computing systems.

As an example, a storage medium or storage media may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUERAY® disks, or other types of optical storage, or other types of storage devices.

As an example, a storage medium or media may be located in a machine running machine-readable instructions, or located at a remote site from which machine-readable instructions may be downloaded over a network for execution.

As an example, various components of a system such as, for example, a computer system, may be implemented in hardware, software, or a combination of both hardware and software (e.g., including firmware), including one or more signal processing and/or application specific integrated circuits.

As an example, a system may include a processing apparatus that may be or include a general purpose processors or application specific chips (e.g., or chipsets), such as ASICs, FPGAs, PLDs, or other appropriate devices.

Figure 23:
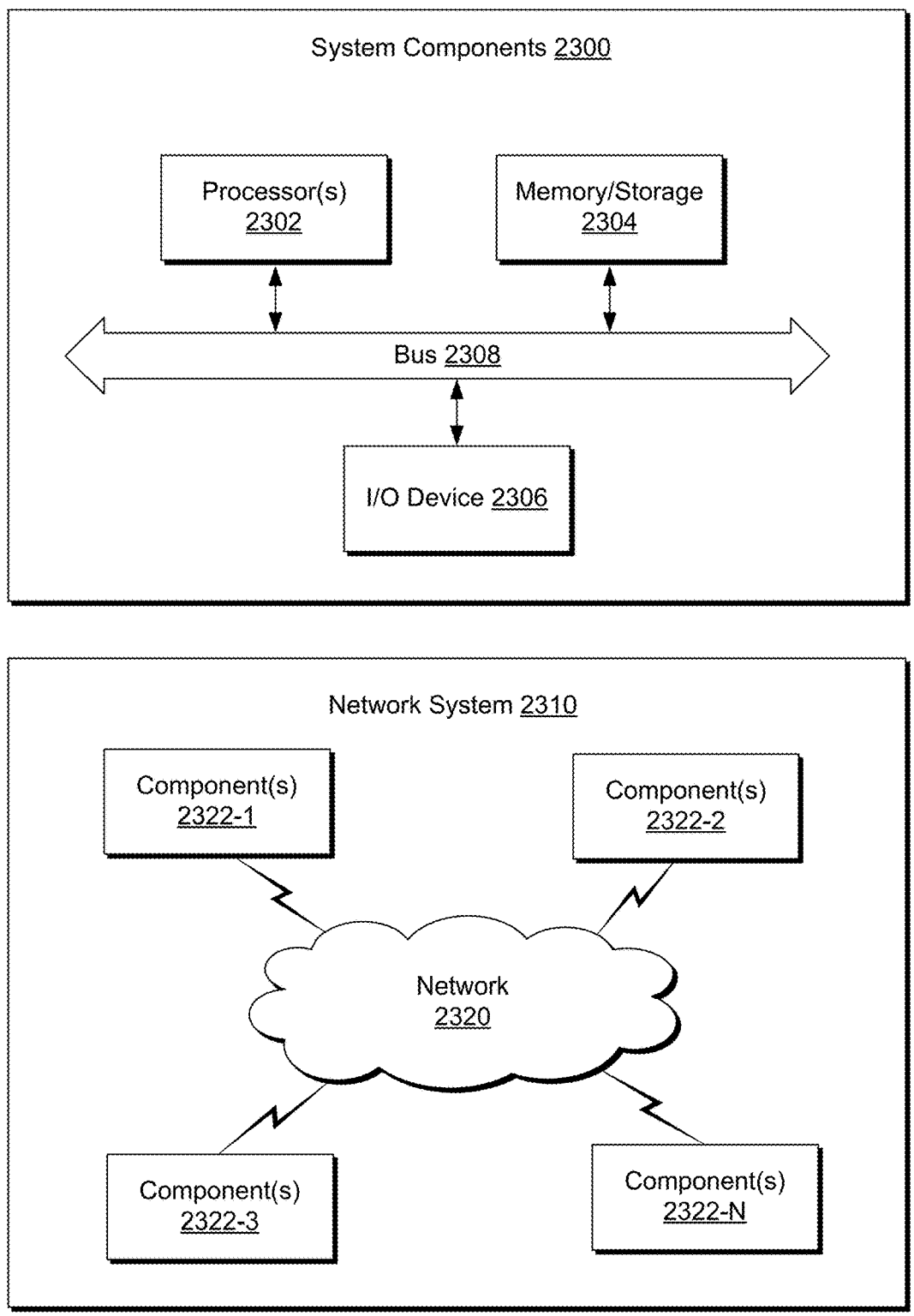
FIG. 23 illustrates example components of a system and a networked system.

FIG. 23 shows components of a computing system 2300 and a networked system 2310. The system 2300 includes one or more processors 2302, memory and/or storage components 2304, one or more input and/or output devices 2306 and a bus 2308. According to an embodiment, instructions may be stored in one or more computer-readable media (e.g., memory/storage components 2304). Such instructions may be read by one or more processors (e.g., the processor(s) 2302) via a communication bus (e.g., the bus 2308), which may be wired or wireless. The one or more processors may execute such instructions to implement (wholly or in part) one or more attributes (e.g., as part of a method). A user may view output from and interact with a process via an I/O device (e.g., the device 2306). According to an embodiment, a computer-readable medium may be a storage component such as a physical memory storage device, for example, a chip, a chip on a package, a memory card, etc.

According to an embodiment, components may be distributed, such as in the network system 2310. The network system 2310 includes components 2322-1, 2322-2, 2322-3, . . . 2322-N. For example, the components 2322-1 may include the processor(s) 2302 while the component(s) 2322-3 may include memory accessible by the processor(s) 2302. Further, the component(s) 2322-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few examples have been described in detail above, those skilled in the art will readily appreciate that many modifications are possible in the examples. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method comprising:
   receiving multi-channel time series data of drilling operations for accessing a reservoir, wherein the multi-channel time series data comprise noise;
   training a deep neural network using the multi-channel time series data to generate a trained deep neural network as part of a computational simulator wherein the deep neural network comprises at least one recurrent unit;
   simulating a drilling operation using the trained deep neural network of the computational simulator to generate a simulation result in a latent space;
   reducing dimensionality of the latent space to generate a reduced space;
   rendering the simulation result in the reduced space to a display, wherein the simulation result is represented as a future physical state, associated with the drilling operation, with respect to one or more past physical states;
   processing the simulation result in the latent space through fully connected components followed by a merge component to generate future multi-channel time series data points that comprise characteristics of the noise and applying the future multi-channel time series data points as input to the trained deep neural network of the computational simulator to generate another simulation result; and
   controlling drilling equipment using at least one of the simulation results, wherein the drilling equipment comprises a rig operatively coupled to a drill string with a drill bit, wherein the controlling the drilling equipment causes the drill bit to directionally drill a borehole in a subsurface formation.

2. The method of claim 1 comprising correlating the simulation result to the future physical state.

3. The method of claim 2 wherein the future physical state is selected from a plurality of pre-defined physical states.

4. The method of claim 2 wherein the rendering the simulation result to the display comprises rendering a graphic of the future physical state associated with the drilling operation to the display within the reduced space.

5. The method of claim 4 wherein the latent space is associated with one of the at least one recurrent unit.

6. The method of claim 1 wherein at least one of the at least one recurrent unit comprises a forget gate long short-term memory unit.

7. The method of claim 1 wherein the rendering the simulation result to a display comprises processing output of one of the at least one recurrent unit.

8. The method of claim 1 wherein the reducing dimensionality comprises applying a principal component analysis process.

9. The method of claim 7 comprising processing a plurality of simulation results to generate a plurality of graphics and rendering an animation of the graphics to the display with respect to the reduced space.

10. The method of claim 1 wherein the rendering comprises rendering a graphic based on the simulation result to the display within a series of graphics that form an animation of the one or more past physical states and the future physical state associated with a plurality of drilling operations.

11. The method of claim 1 wherein the multi-channel time series data of the drilling operations are for drilling operations performed with respect to an environment using equipment wherein the environment and the equipment form a dynamic system.

12. The method of claim 11 wherein the computational simulator is configured to simulate dynamic behavior of the dynamic system.

13. The method of claim 1 comprising calibrating a controller using the simulation result to generate a calibrated controller.

14. The method of claim 13 comprising controlling at least one drilling operation using the calibrated controller.

15. A system comprising:
    a processor;
    memory accessible by the processor;
    processor-executable instructions stored in the memory and executable to instruct the system to:
    receive multi-channel time series data of drilling operations for accessing a reservoir, wherein the multi-channel time series data comprise noise;
    train a deep neural network using the multi-channel time series data to generate a trained deep neural network wherein the deep neural network comprises at least one recurrent unit;
    simulate a drilling operation using the trained deep neural network to generate a simulation result in a latent space;
    reduce dimensionality of the latent space to generate a reduced space;
    render the simulation result in the reduced space to a display, wherein the simulation result is represented as a future physical state, associated with the drilling operation, with respect to one or more past physical states;
    and process the simulation result in the latent space through fully connected components followed by a merge component to generate future multi- channel time series data points that comprise characteristics of the noise and apply the future multi- channel time series data points as input to the trained deep neural network of the computational simulator to generate another simulation result; and
    controlling drilling equipment using at least one of the simulation results, wherein the drilling equipment comprises a rig operatively coupled to a drill string with a drill bit, wherein the controlling the drilling equipment causes the drill bit to directionally drill a borehole in a subsurface formation.

16. One or more non-transitory computer-readable storage media comprising processor-executable instructions to instruct a computing system to:
    receive multi-channel time series data of drilling operations for accessing a reservoir, wherein the multi-channel time series data comprise noise;
    train a deep neural network using the multi-channel time series data to generate a trained deep neural network wherein the deep neural network comprises at least one recurrent unit;
    simulate a drilling operation using the trained deep neural network to generate a simulation result in a latent space;

reduce dimensionality of the latent space to generate a reduced space;

and render the simulation result in the reduced space to a display, wherein the simulation result is represented as a future physical state, associated with the drilling operation, with respect to one or more past physical states;

process the simulation result in the latent space through fully connected components followed by a merge component to generate future multi-channel time series data points that comprise characteristics of the noise and apply the future multi-channel time series data points as input to the trained deep neural network of the computational simulator to generate another simulation result; and control drilling equipment using at least one of the simulation results, wherein the drilling equipment comprises a rig operatively coupled to a drill string with a drill bit, wherein the controlling the drilling equipment causes the drill bit to directionally drill a borehole in a subsurface formation.

* * * * *